(12) United States Patent
Dong

(10) Patent No.: US 12,028,028 B2
(45) Date of Patent: Jul. 2, 2024

(54) ISOLATION CIRCUIT SYSTEMS AND METHODS THEREOF

(71) Applicant: 2Pai Semiconductor Co., Limited, Shanghai (CN)

(72) Inventor: Zhiwei Dong, Shanghai (CN)

(73) Assignee: 2PAI SEMICONDUCTOR CO., LIMITED, Shanghai (CN)

(*) Notice: Subject to any disclaimer, the term of this patent is extended or adjusted under 35 U.S.C. 154(b) by 591 days.

(21) Appl. No.: 17/390,560

(22) Filed: Jul. 30, 2021

(65) Prior Publication Data
US 2021/0359650 A1  Nov. 18, 2021

Related U.S. Application Data

(63) Continuation-in-part of application No. 17/025,565, filed on Sep. 18, 2020, now Pat. No. 11,431,302,
(Continued)

(30) Foreign Application Priority Data

| May 26, 2017 | (CN) | 201710386724.8 |
| Jul. 10, 2017 | (CN) | 201710558211.0 |
| Jun. 30, 2021 | (CN) | 202111073681.1 |

(51) Int. Cl.
*H03F 1/32* (2006.01)
*H01G 4/38* (2006.01)
(Continued)

(52) U.S. Cl.
CPC ............... *H03F 3/085* (2013.01); *H01G 4/38* (2013.01); *H03F 3/387* (2013.01);
(Continued)

(58) Field of Classification Search
CPC ........................................................ H03F 1/32
(Continued)

(56) References Cited

U.S. PATENT DOCUMENTS 4,911,167 A * 3/1990 Corenman ........... A61B 5/0245
600/513
7,486,114 B2 * 2/2009 Chen ................... H04L 25/0274
327/20
(Continued)

*Primary Examiner* — Henry Choe
(74) *Attorney, Agent, or Firm* — Quarles & Brady LLP

(57) ABSTRACT

A digital isolator device which includes a first input buffer configured to receive a first differential signal from a transmitter and to provide a second differential signal, the first differential signal being characterized by a first magnitude, the second differential signal being characterized by a second magnitude, the first magnitude being greater than the second magnitude. The device also includes a second input buffer configured to receive a third differential signal from the transmitter and to provide a fourth differential signal, the second input buffer being coupled to the second ground terminal. The device also includes a common-mode circuit coupled to the second differential signal and the fourth differential signal, the common-mode circuit being configured to reduce a common-mode transient voltage, the common-mode transient voltage being associated with a voltage differential between the first ground terminal and the second ground terminal.

20 Claims, 28 Drawing Sheets

Related U.S. Application Data which is a continuation of application No. 15/990,571, filed on May 25, 2018, now Pat. No. 10,812,027.

(51) Int. Cl.
*H03F 3/08* (2006.01)
*H03F 3/387* (2006.01)
*H03F 3/45* (2006.01)
*H03K 19/0175* (2006.01)

(52) U.S. Cl.
CPC ..... *H03F 3/45475* (2013.01); *H03F 3/45928* (2013.01); *H03K 19/017545* (2013.01); *H03F 2200/271* (2013.01); *H03F 2200/273* (2013.01); *H03F 2200/537* (2013.01)

(58) Field of Classification Search
USPC .................................................. 330/59, 152
See application file for complete search history.

(56) References Cited

U.S. PATENT DOCUMENTS

| | | | |
|---|---|---|---|
| 8,139,700 B2* | 3/2012 | Beukema | H03K 5/15013 327/147 |
| 9,099,976 B2* | 8/2015 | Acosta-Serafini | H03G 3/3078 |
| 11,165,430 B1* | 11/2021 | Manipatruni | H03K 19/23 |

* cited by examiner

ISOLATION CIRCUIT SYSTEMS AND METHODS THEREOF

CROSS-REFERENCES TO RELATED APPLICATIONS

The present invention is a continuation-in-part application to U.S. patent application Ser. No. 17/025,565, entitled "ISOLATION CIRCUIT", filed on Sep. 18, 2020, which is a continuation of U.S. patent application Ser. No. 15/990,571, which claims priority to Chinese Patent Application No. 201710386724.8, filed on May 26, 2017, Chinese Patent Application No. 201710558211.0, filed on Jul. 10, 2017. The present invention also claims priority to Chinese Application No. 20211073681.1, filed on Jun. 30, 2021. These four applications are commonly owned and incorporated by reference herein for all purposes.

TECHNICAL FIELD

The present disclosure generally relates to the electronic circuit technology field, and more particularly, to isolation circuits and methods thereof.

BACKGROUND

An optocoupler is a device to transmit signals via a medium of light. Usually, the light emitter and the receiver (photosensitive semiconductor tube) are packaged in the same chip. When an input terminal of the optocoupler receives a current signal, the light is emitted from the light emitter. After the light is received by the receiver, a photocurrent is generated and output from an output terminal of the optocoupler. Therefore, an "electrical-optical-electrical" conversion is achieved. In the optocoupler, signals are coupled from an input terminal to an output terminal via the medium of light. The optocoupler is a technology that has been used for more than 50 years. For the first time, the optocoupler realizes signal isolation by a single device, and it is widely used in power control circuits.

However, the optocoupler has some drawbacks. Because electrical properties of a light-emitting diode vary with temperature, and electrical performances of the optocoupler vary with temperature and are unstable. Also, the optocoupler also has a performance degradation issue because of the aging of the light-emitting diode and isolated plastics. Further, the optocoupler also has a low common-mode rejection ratio because of a parasitic capacitance between the light-emitting diode and a receiving circuit. When there is a large common-mode voltage change on both sides (e.g. 30 kV/us), the light-emitting diode wrongly emits light due to a parasitic capacitance current. Finally, according to principles, the optocoupler also has some drawbacks such as low speed, high power cost, and not being easy to integrate.

Existing isolation circuits have been inadequate for various reasons explained below. New and improved isolation devices and methods are desired.

BRIEF SUMMARY OF THE INVENTION

The present invention is directed to electrical circuits and methods. In a specific embodiment, the present invention provides a digital isolation device that includes a pair of buffers that store incoming signals at a first voltage level. A common-mode circuit is configured to, among other things, reduce a common-mode transient voltage associated with the incoming signals. A latch circuit is coupled to the common-mode circuit and stores intermediate signals associated with the common-mode circuit and the incoming signals. There are other embodiments as well.

A specific embodiment provides a digital isolator device which includes a first input buffer configured to receive a first differential signal from a transmitter and to provide a second differential signal, the first differential input signal being characterized by a first magnitude, the second differential signal being characterized by a second magnitude, the first magnitude being greater than the second magnitude, the transmitter being coupled to a first ground terminal, the first input buffer being coupled to a second ground terminal. The device also includes a second input buffer configured to receive a third differential signal from the transmitter and to provide a fourth differential signal, the second input buffer being coupled to the second ground terminal. The device also includes a common-mode circuit coupled to the second differential signal and the fourth differential signal, the common-mode circuit being coupled to a bias voltage and may include a resistor pair, the common-mode circuit being configured to reduce a common-mode transient voltage, the common-mode transient voltage being associated with a voltage differential between the first ground terminal and the second ground terminal. The device also includes a latch circuit configured to store the second differential signal and the fourth differential signal for a time interval.

One general aspect of certain embodiments includes a digital isolator device where the transmitter is configured on a first die and the common-mode circuit is configured on a second die. The digital isolator device may include an amplifier coupled to the latch circuit. The common-mode circuit may include a crossover circuit. The crossover circuit may include a first switch and a second switch, the first switch being coupled to the second differential signal, the second switch being coupled to the fourth differential signal. The first switch may include a first drain, a first source, and a first gate, the first source being coupled to the bias voltage, the first gate being coupled to the second differential signal, the first drain being coupled to the fourth differential signal; and the second switch may include a second drain, a second source, and a second gate, the second source being coupled to the bias voltage, the second gate being coupled to the fourth differential signal, the second drain being coupled to the third differential signal. The crossover circuit is coupled to a supply voltage. The crossover circuit is coupled to the second ground terminal. The common-mode circuit may include a first crossover circuit and a second crossover circuit, the first crossover circuit being coupled to a supply voltage, the second crossover circuit being coupled to the second ground terminal. The first crossover circuit may include a first pair of switches configured in parallel and the second crossover circuit may comprise a second pair of switches configured in parallel. The common circuit may include PMOS transistors configured in a crossover configuration. The common circuit may include BJT transistors configured in a crossover configuration. The first input buffer may include a first capacitor and a second capacitor, the first capacitor being directly coupled to the first differential signal, the second capacitor being directly coupled to the second ground terminal; and a second input buffer may include a third capacitor and a fourth capacitor, the third capacitor being directly coupled to the third differential signal, the fourth capacitor being directly coupled to the second ground terminal. The digital isolator device may include an inverter configured to generate the third differential signal.

Another general aspect of certain embodiments includes a digital isolator device. The digital isolator device also includes a latch module configured to store a first isolation signal and a second isolation signal for a time interval and output a latched signal, may include: a first latch input terminal configured to receive a first latch input signal, and a second latch input terminal configured to receive a second latch input signal. The device also includes a common-mode module configured to receive a common-mode current generated due to the common-mode transient between a first die and a second die, may include: a first input terminal coupled to the first latch input terminal and configured to receive a first common-mode input signal, a second input terminal coupled to the second latch input terminal and configured to receive a second common-mode input signal, a first common-mode branch coupled to the first input terminal and characterized by a first impedance value, and a second common-mode branch coupled to the second input terminal and characterized by a second impedance value. The latch module and the common-mode module are connected in parallel. The common-mode current flowing through the common-mode module is associated with a common-mode voltage and a differential-mode voltage of the latch module.

In various embodiments, the common-mode current is associated with the first impedance value of the first common-mode branch, the first impedance value is associated with the first latch input signal. The common-mode current is associated with the second impedance value of the second common-mode branch, the second impedance value is associated with the second latch input signal of the latch module. The common-mode module is coupled to a bias voltage, and the bias voltage is associated with a common-mode voltage of the latch module. The first common-mode branch is turned on when input voltages of the latch module are lower than the bias voltage, and the second common-mode branch is turned on when the input voltages of the latch module are higher than the bias voltage.

Yet another general aspect includes a method for providing isolation between two dies. The method includes receiving an incoming signal. The method also includes generating a differential pair of input signals based on the incoming signal received. The method also includes providing isolation between a first die and a second die and generating isolation signals based on the differential input signals, where the isolation signals are smaller than the input signals in amplitude. The method also includes processing the isolation signals by a common-mode module to reduce common-mode noise. The method also includes latching the isolation signals processed by the common-mode module at a certain level and outputting a latched signal. The method also includes amplifying the latched signal and outputting the amplified signal. The effective differential isolation signals are amplified by the common-mode module during common-mode transients.

It is to be appreciated that embodiments of the present invention provide many advantages over conventional techniques. By adding a common-mode circuit to the isolation circuit, common-mode transient voltage associated with a voltage difference between separate ground terminals can be reduced. Moreover, the common-mode circuit can also amplify effective differential signals. Therefore, the common-mode transient immunity (CMTI) of the isolation circuit and the effective signal transmission can be vastly improved. Embodiments of the present invention can be implemented in conjunction with existing systems and processes. Depending on the implementation, the use of a common-mode circuit can be readily incorporated into existing systems and methods. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
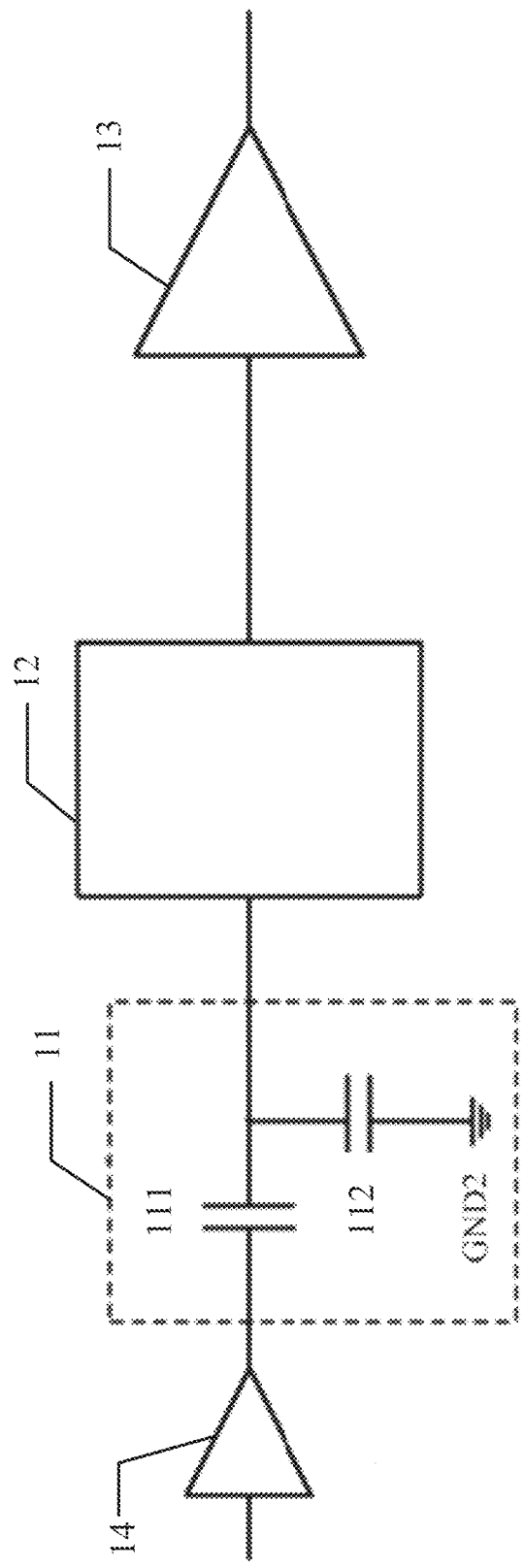
FIG. 1 schematically illustrates a diagram of an isolation circuit according to an embodiment of the present disclosure.

The present invention is directed to electrical circuits and methods. In a specific embodiment, the present invention provides a digital isolation device that includes a pair of buffers that store incoming signals at a first voltage level. A common-mode circuit is configured to, among other things, reduce a common-mode transient voltage associated with the incoming signals. A latch circuit is coupled to the common-mode circuit and stores intermediate signals associated with the common-mode circuit and the incoming signals. There are other embodiments as well.

As mentioned above, digital isolators use semiconductor process technology to create transformers, or capacitors to transfer data. Digital isolators provide multichannel isolation solutions with a much smaller footprint, increase system reliability due to a lower failure rate, operate over a wider temperature range (−40° C. to 125° C.), and do not age or degrade over time. Moreover, digital isolators can transmit a wider range of signals, from DC to 300 MHz, while traditional optocouplers can only transmit signals with frequencies less than 100 MHz.

A digital isolation circuit generally includes, but is not limited to, an isolation module, a transmitter circuit, and a receiver circuit. Interference may arise in communicating data between two circuits (e.g., the transmitter circuit and the receiver circuit) that have galvanically isolated (e.g., having the effect of blocking direct-current electricity) ground terminals. The isolation module is configured to provide isolation between the two isolated circuits (e.g., the transmitter circuit and the receiver circuit). Usually, the transmitter circuit and the receiver circuit operate on different voltages and are connected to separate ground terminals, when there are high-slew-rate (high-frequency) transients between the transmitter circuit and the receiver circuit, a large common-mode current will be induced, such phenomenon is referred to as Common-Mode Transient (CMT). The ability of the isolation circuit to withstand this high-slew-rate voltage transient without an upset at the isolation circuit output is defined as the common-mode transient immunity (CMTI).

The common-mode current induced by CMT can cause several problems. For example, when the isolation circuit is disposed between two separate dies (e.g., a first die and a second die), wherein a latch circuit disposed on the second die comprises two latch input terminals coupled to the isolation circuit, the common-mode current generated by CMT will cause common-mode voltages to be applied to the two latch input terminals of the latch circuit. The common-mode voltage $V_{com}$ can be expressed by the following equation:

$$V_{com} = i_{cmti} \times R_{in}$$

where $i_{cmti}$ is the common-mode current generated by CMT, and $R_{in}$ is the common-mode input impedance of the latch circuit. The latch circuit may be saturated when the common-mode voltages applied to the two latch input terminals are too high, therefore resulting in latch malfunction.

On the other hand, although theoretically, the common-mode input impedance values of the two latch input terminals should be the same, there may be an impedance mismatch $\Delta R_{in}$ between the two common-mode input impedance values due to the manufacturing process in practice. Therefore, the existence of the impedance mismatch $\Delta R_{in}$ may convert the common-mode voltage into a differential-mode voltage, which will be superimposed on the differential input signals of the latch circuit, resulting in signal transmission errors. The differential-mode voltage caused by the impedance difference $\Delta R_{in}$ can be expressed by the following equation:

$$V_{diff} = i_{cmti} \times (R_{in} + \Delta R_{in}) - i_{cmti} \times R_{in} = i_{cmti} \times \Delta R_{in}$$

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Referring to FIG. 1, FIG. 1 schematically illustrates a diagram of an isolation circuit according to an embodiment of the present disclosure. As shown in FIG. 1, the isolation circuit includes an isolation module including a primary isolation branch 11, a latch 12, an amplifier 13, and a buffer 14. Specifically, the primary isolation branch 11 includes a primary isolation capacitor 111 and a first division capacitor 112 in series.

In some embodiment, the isolation module is configured to generate an isolation signal based on an input signal from a first die and to provide isolation between the first die and the second die.

In some embodiments, the primary isolation capacitor 111 in the primary isolation branch 11 includes a first plate to receive an input signal, and a second plate coupled with a first input terminal of the latch 12. The first division capacitor 112 includes a first plate to receive a ground signal of the second die GND2, and a second plate coupled with the second plate of the primary isolation capacitor 111 and the first input terminal of the latch 12, where a voltage on the first division capacitor (isolation signal) is output to a first input terminal of the latch 12. Therefore, the isolation signal is smaller than the input signal in amplitude. In addition, an output terminal of the latch 12 is coupled with an input terminal of the amplifier 13. The primary isolation capacitor 111 acts a role of isolating voltage between the first die and the second die, an isolation voltage has a huge range. In some embodiment, the isolation voltage maybe high to 20,000V.

In some embodiment, the primary isolation capacitor 111 may be disposed in the first die, or be disposed on the second die. In some embodiment, a portion of the primary isolation capacitor 111 may be disposed on the first die and another portion of the primary isolation capacitor 111 may be disposed on the second die. The flexible location of the primary isolation capacitor 111 is beneficial to the design of the isolation circuit and isolation voltage.

In some embodiments, the primary isolation capacitor 111 and the first division capacitor 112 both may have very low capacitance values at a femtofarad (fF) level, and the isolation circuit generally has a leakage current. In a situation where the leakage current is in a picoampere (pA) level, capacitors can maintain a voltage at a certain level for a millisecond level. Therefore, the isolation signal output from the primary isolation branch 11 cannot be maintained when the input signal remains stable, thereby causing negative effects on the isolation.

Therefore, there is a need to stabilize the isolation signal output from the primary isolation capacitor 111 so that an output signal from the amplifier 13 remains stable. Accordingly, the latch 12 is required to latch the isolation signal at a certain level and outputs a latched signal.

In some embodiment, the latch 12 may have a small flipping voltage to recognize digital signals with small amplitude differences. So that even a small signal difference can be recognized. Therefore, the primary isolation capacitor 111 can be manufactured in a small value with a thick dielectric, an isolation between two dies with high voltage difference can be achieved. In some embodiment, the latch 12 is a voltage latch.

The amplifier 13 is configured to amplify the latched signal. In some embodiment, the amplifier 13 amplifies the latched signal back to the original quantity of the input signal.

In some embodiment, before the input signal is transmitted to the isolation module, the input signal may be filtered. As shown in FIG. 1, the buffer 14 includes an input terminal to receive the input signal from a circuit, such as an application circuit on the first die, and an output terminal is coupled with the first plate of the primary isolation capacitor 111. The buffer 14 may be disposed in a first die. It should be noted that, the buffer 14 is not a compulsory component in the isolation circuit.

Figure 2:
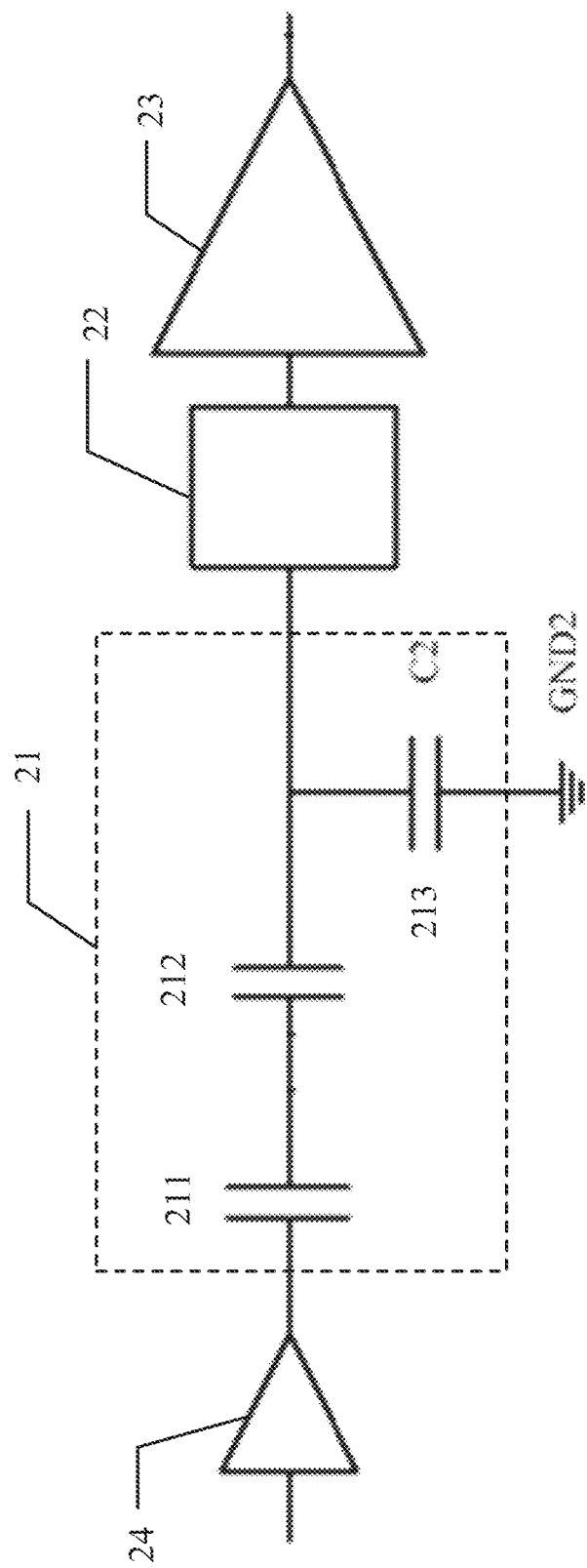
FIG. 2 schematically illustrates a diagram of an isolation circuit according to another embodiment of the present disclosure.

Referring to FIG. 2, FIG. 2 schematically illustrates a diagram of an isolation circuit according to another embodiment of the present disclosure. The isolation circuit includes an isolation module including a primary isolation branch 21, a latch 22, an amplifier 23 and a buffer 24. The primary isolation branch 21 includes a first division capacitor 213.

The main difference from the isolation circuit as shown in FIG. 1 lies in that a first primary isolation capacitor 211 and a second primary isolation capacitor 212 in series constitute a primary isolation capacitor in FIG. 2. Other components are similar to the isolation circuit as shown in FIG. 1 and are not described in detail hereinafter.

In some embodiment, the first primary isolation capacitor 211 and a second primary isolation capacitor 212 are disposed in different dies. For example, the first primary isolation capacitor 211 may be disposed on the first die, and the second primary isolation capacitor 212 may be disposed on the second die. By disposing the first isolation capacitor 211 on the first die and the second isolation capacitor 212 on the second die, the isolation circuit could have a higher isolation voltage and the isolation circuit can be designed with a more flexibility.

In some embodiment, the first primary isolation capacitor 211 and the second primary isolation capacitor 212 may have a same capacitance value.

Generally, a common-mode noise exists between the first die and the second die, and the common-mode noise is generally indistinguishable from a desired signal. When the common-mode noise increases significantly, for example, when it reaches a certain proportion of the desired signal or reaches the same level as the desired signal (for example, 100V/ns), the noise signal may have a significant effect on the desired signal, and may result in problems such as signal distortion or loss. A differential input circuitry may be introduced to reduce the common-mode noise according to an embodiment of this disclosure.

Figure 3:
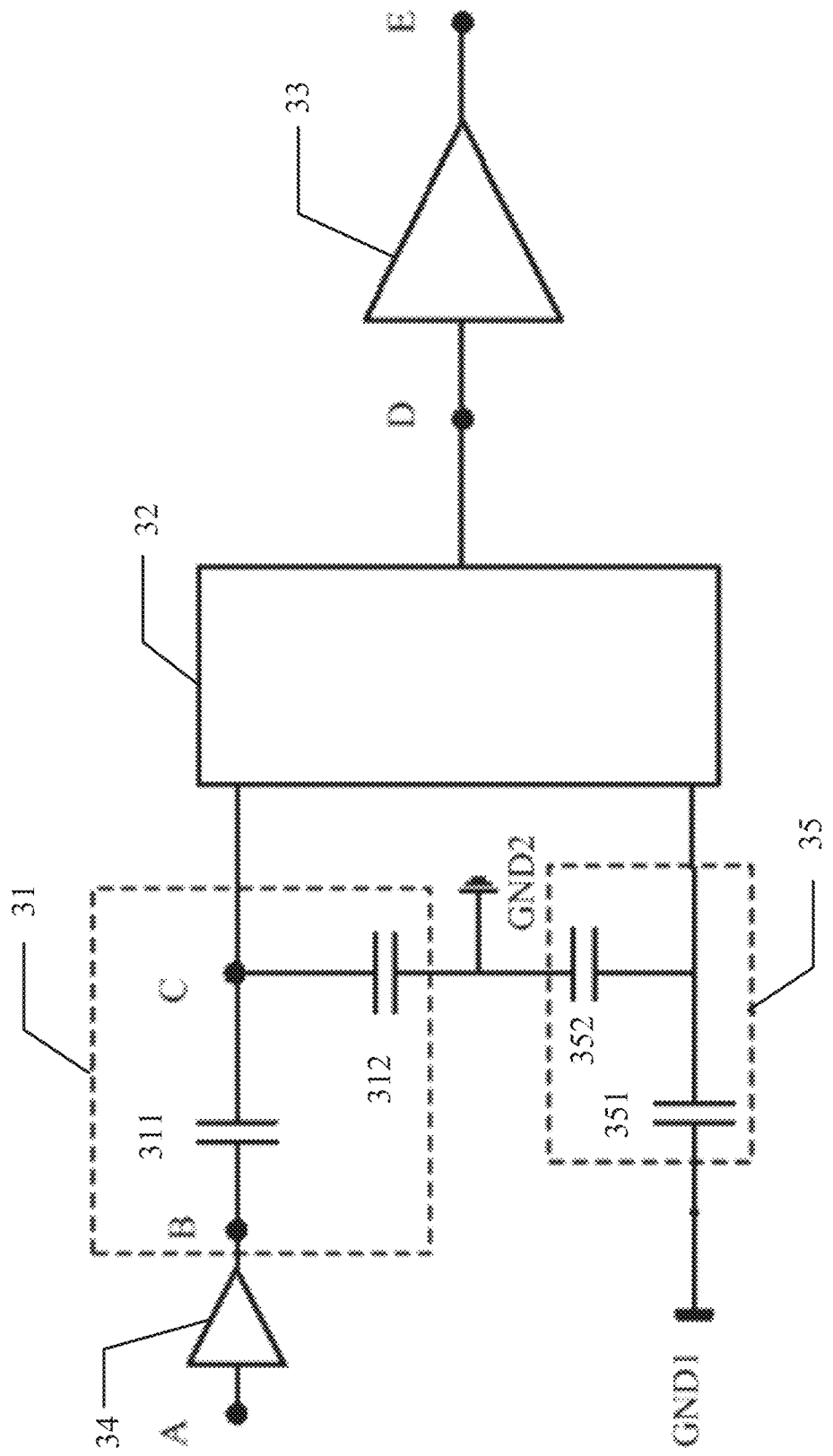
FIG. 3 schematically illustrates a diagram of an isolation circuit according to another embodiment of the present disclosure.

Referring to FIG. 3, FIG. 3 schematically illustrates a diagram of an isolation circuit according to another embodiment of the present disclosure. The isolation circuit includes: an isolation module including a primary isolation branch 31 and a common-mode branch 35, a latch 32, an amplifier 33 and a buffer 34. The amplifier 33 and the buffer 34 are similar to above circuits and are not described in detail hereinafter. The primary isolation branch 31 includes a primary isolation capacitor 311 and a first division capacitor 312 in series. The common-mode branch 35 is coupled to the latch 32 to output a common-mode signal to a second input terminal of the latch 32, and to reduce a common-mode noise on the first die and the second die.

In some embodiment, the common-mode branch 35 includes an auxiliary isolation capacitor 351 and a second division capacitor 352 in series. Specifically, a first plate of the auxiliary isolation capacitor 351 is coupled with a ground signal GND1 of the first die, a first plate of the first division capacitor 312 and a first plate of the second division capacitor 352 coupled with the ground signal GND2 of the second die, and a second plate of the second division capacitor 352 is coupled with the second input terminal of the latch 32.

As shown in FIG. 3, the first plate of the auxiliary isolation capacitor 351 is coupled with the ground signal GND1 of the first die, so that the latch 32 may receive the common-mode signal to reduce the common-mode noise and increase a common-mode rejection ratio in the isolation circuit.

Figure 4:
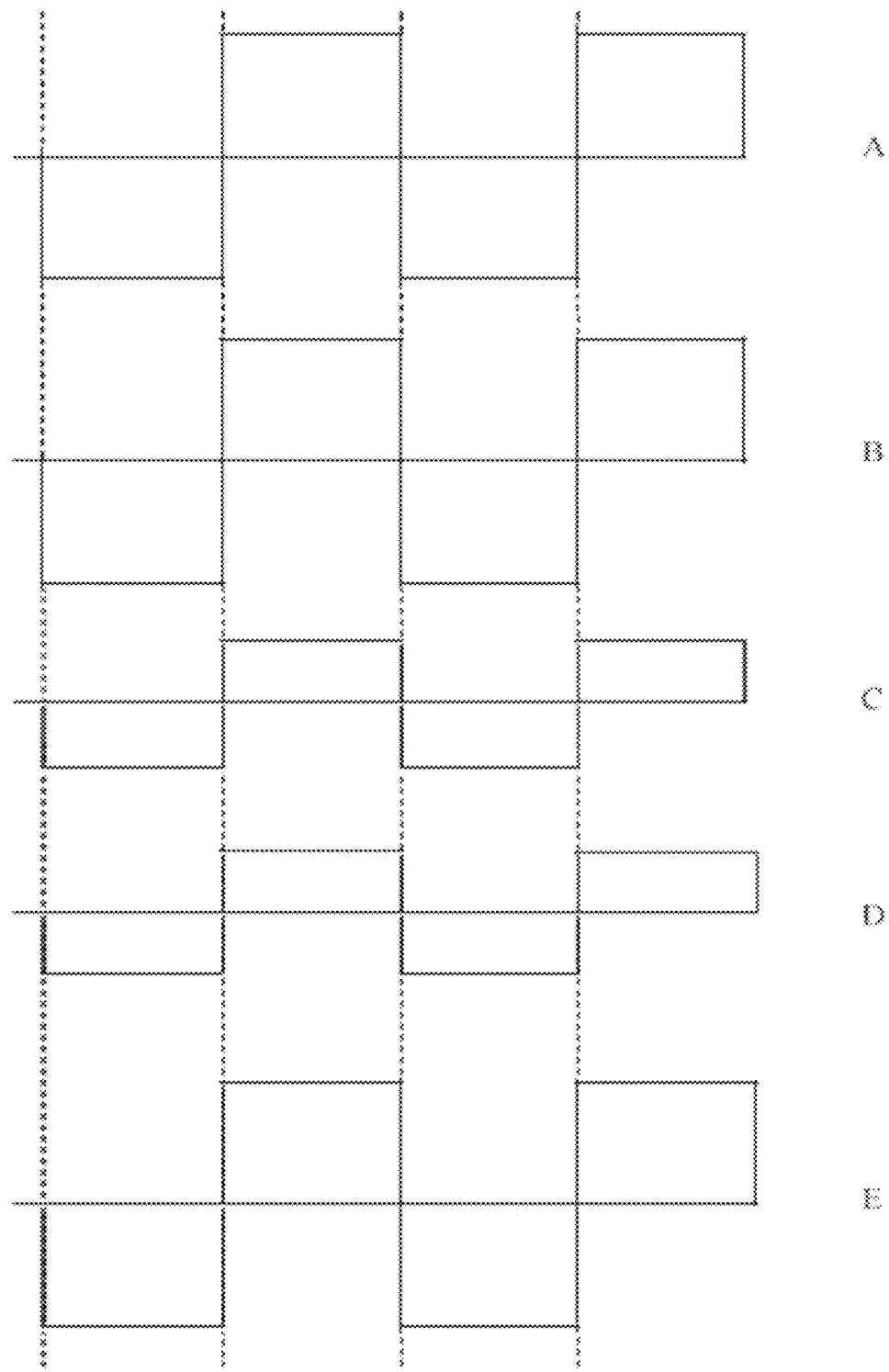
FIG. 4 schematically illustrates a timing diagram of the isolation circuit shown in FIG. 3.

FIG. 4 schematically illustrates a timing diagram of the isolation circuit shown in FIG. 3. As shown in FIG. 3 and FIG. 4, a waveform A, B, C, D and E in FIG. 4 represents a signal at node A, B, C, D and E in FIG. 3 respectively.

If an input signal level is VDD and capacitance values of the primary isolation capacitor 311 and the first division capacitor 312 are denoted by C1 and C2 respectively, a level of the isolation signal at a node C is C1/(C1+C2)*VDD. In addition, a latched signal level at a node D may also be C1/(C1+C2)*VDD due to the presence of the latch 32. However, in some embodiment, the level at the node D may have a certain amplification with respect to the level at the node C, for example, the level at the node D may be 2-3 times as high as the level at the node C. Finally, after the latched signal is amplified by the amplifier 33, a level at a node E may have a same amplitude with the level at the node A, or the latched signal is amplified to a required level for further processing.

Figure 5:
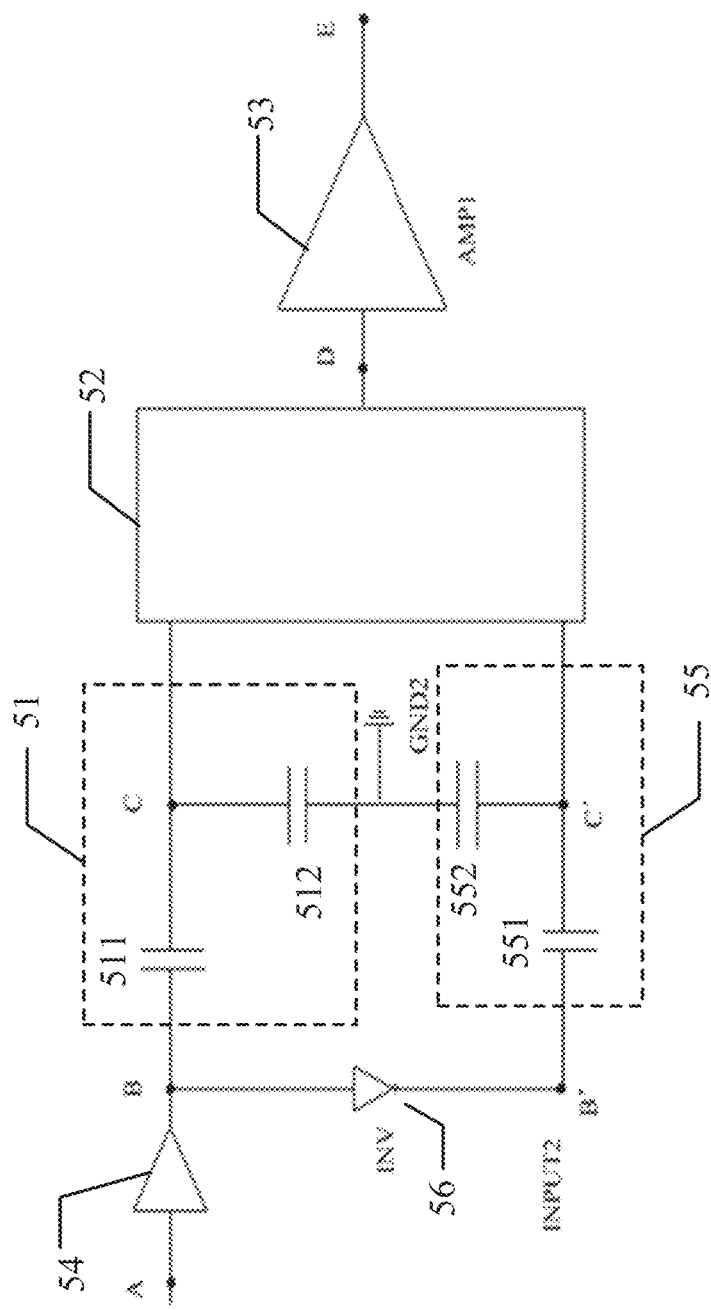
FIG. 5 schematically illustrates a diagram of an isolation circuit according to another embodiment of the present disclosure.

Referring to FIG. 5, FIG. 5 schematically illustrates a diagram of an isolation circuit according to another embodiment of the present disclosure. The isolation circuit includes an isolation module including a primary isolation branch 51 and a common-mode branch 55, a latch 52, an amplifier 53, a buffer 54, and an inverter 56. The isolation module includes a primary isolation branch 51 including a primary isolation capacitor 511 and a first division capacitor 512 in series.

The primary isolation branch 51, the latch 52, the amplifier 53, and the buffer 54 are similar to above circuits and are not described in detail hereinafter. A common-mode branch 55 includes an auxiliary isolation capacitor 551 and a second division capacitor 552 in series, and the inverter 56 ensures that a signal in a first input terminal INPUT1 and a signal in a second input terminal INPUT2 are opposite in phase. In some embodiment, the inverter 56 is disposed in the first die.

In some embodiment, the inverter 56 outputs an inverted input signal to the common-mode branch 55. A first plate of the auxiliary isolation capacitor 551 is coupled with the inverted input signal, a first plate of the first division capacitor 512 and a first plate of the second division capacitor 552 coupled with a ground signal of the second die GND2, and a second plate of the second division capacitor 552 is coupled with the second input terminal of the latch 52.

In some embodiment, the inverter 56 includes an input terminal coupled with a first plate of the primary isolation capacitor 511, and an output terminal coupled with a first plate of the auxiliary isolation capacitor 551. Further, the input terminal of the inverter 56 may be coupled with the first plate of the auxiliary isolation capacitor 551, and the output terminal of the inverter 56 may be coupled with the first plate of the primary isolation capacitor 511.

In some embodiments, the primary isolation capacitor 511 and the auxiliary isolation capacitor 551 may have various arrangements. In some embodiments, at least one of the primary isolation capacitor 511 and the auxiliary isolation capacitor 551 is disposed in the first die or the second die. For example, the primary isolation capacitor 511 and the auxiliary isolation capacitor 551 are disposed in the first die; or, the primary isolation capacitor 511 and the auxiliary isolation capacitor 551 are disposed in the second die; or, the primary isolation capacitor 511 is disposed in the first die and the auxiliary isolation capacitor 551 is disposed in the second die; or, the primary isolation capacitor 511 is disposed in the second die and the auxiliary isolation capacitor 551 is disposed in the first die.

In some embodiment, if capacitance values of the primary isolation capacitor 511, the first division capacitor 512, the auxiliary isolation capacitor 551 and the second division capacitor 552 are denoted by C1, C2, C3 and C4 respectively, a capacitance ratio between the primary isolation capacitor 511 and the first division capacitor 512 is equal to a capacitance ratio between the auxiliary isolation capacitor 551 and the corresponding second division capacitor 552 (i.e. C1:C2=C3:C4).

In some embodiment, the primary isolation capacitor 511 and the auxiliary isolation capacitor 551 have a same capacitance value; the first division capacitor 512 and the second division capacitor 552 have a same capacitance value (i.e. C1=C3; C2=C4), which are beneficial to mass production, procurement of components and reduction of system cost. A system may be stable due to the same value between capacitors.

Figure 6:
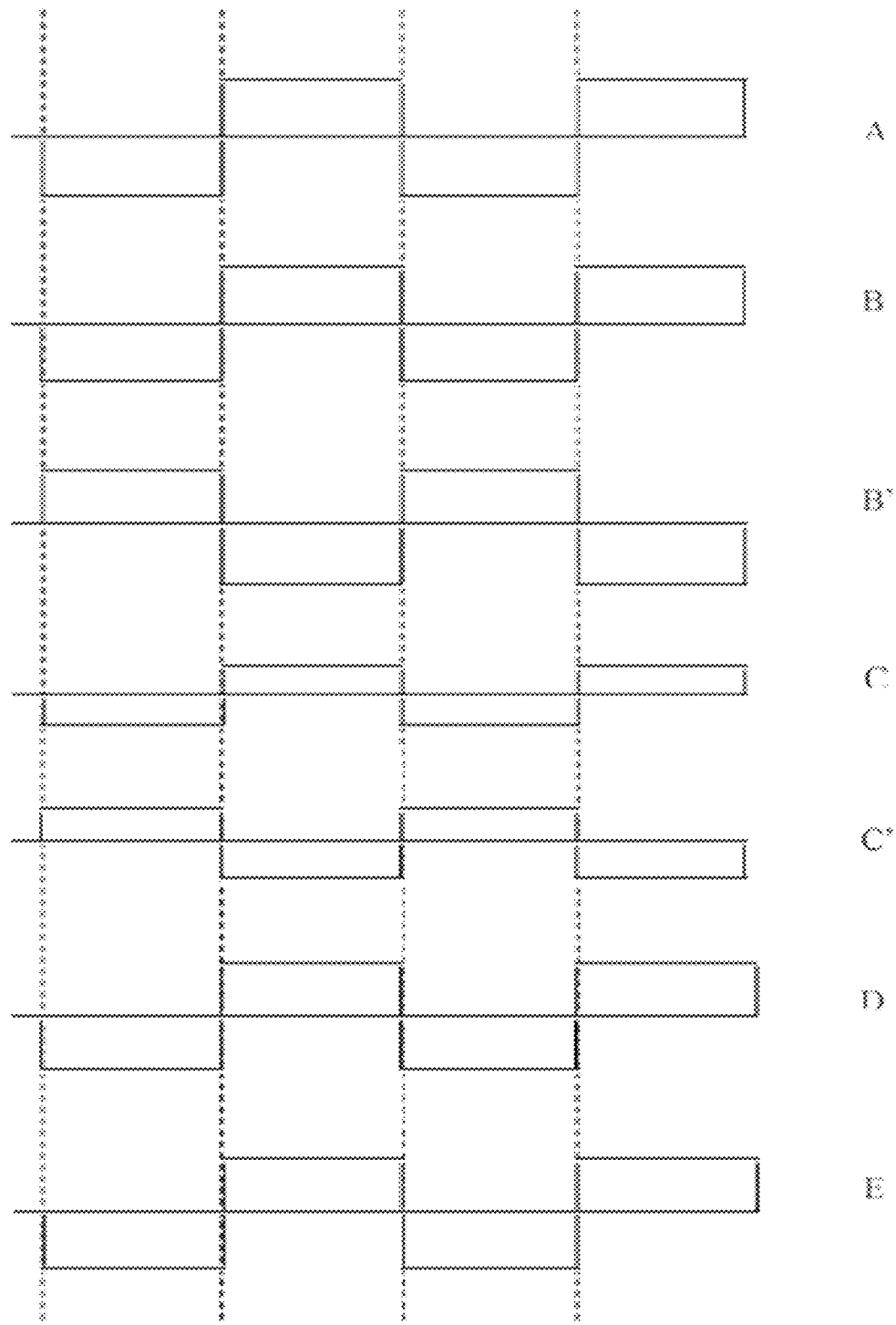
FIG. 6 schematically illustrates a timing diagram of the isolation circuit shown in FIG. 5.

Referring to FIG. 6, FIG. 6 schematically illustrates a timing diagram of the isolation circuit shown in FIG. 5. As shown in FIG. 5 and FIG. 6, a waveform A, B, C, D and E in FIG. 6 represents a signal at node A, B, C, D and E in FIG. 5 respectively. If a level of the input signal at a node A is VDD, a level of the isolation signal at a node C is C1/(C1+C2)*VDD. The input signal at a node B has an opposite phase with the inverted signal at a node B' due to the inverter INV. So that a level at a node C' is −C3/(C3+C4)*VDD. Therefore, a level at a node D is C1/(C1+C2)*VDD+C3/(C3+C4)*VDD. In some embodiment, the level at the node D may have a certain amplification with respect to the level at the node C, for example, the level at the node D may be 3 times as high as the level at the node C. After the latched signal is amplified by the amplifier 53, a level at a node E may have a same amplitude with the level at node A, or the latched signal is amplified to a required level for further processing.

In some embodiment, capacitance values of the first division capacitor 512 and the second division capacitor 552 may be 0, that is, the second plate of the primary isolation capacitor 511 and the second plate of the auxiliary isolation capacitor 551 does not receive the ground signal from the second chip. However, in practice, parasitic capacitance also occurs when the connection is disconnected. In some embodiment, capacitance values of the first division capacitor 512 and the second division capacitor 552 may also be infinitely close to zero, and it is not meant to be limiting. The first division capacitor 512 and the second division capacitor 552 may also be a combination of an input capacitance of the circuit and other capacitance such as a parasitic capacitance.

In some embodiment, a capacitance ratio between the primary isolation capacitor 511 and the first division capacitor 512 and a capacitance ratio between the auxiliary isolation capacitor 551 and the corresponding second division capacitor 552 may be C1:C2=C3:C4=1:0. In practice, a large capacitance value of the primary isolation capacitor 511 and the auxiliary isolation capacitor 551 increases the cost. In some embodiment, a capacitance ratio between the primary isolation capacitor 511 and the first division capacitor 512 is from 1:0 to 1:1000, such as 1:10, 1:30, 1:50, 1:150, 1:200 or the other like. In some embodiment, a capacitance ratio between the primary isolation capacitor 511 and the first division capacitor 512 is 1:100.

Figure 7:
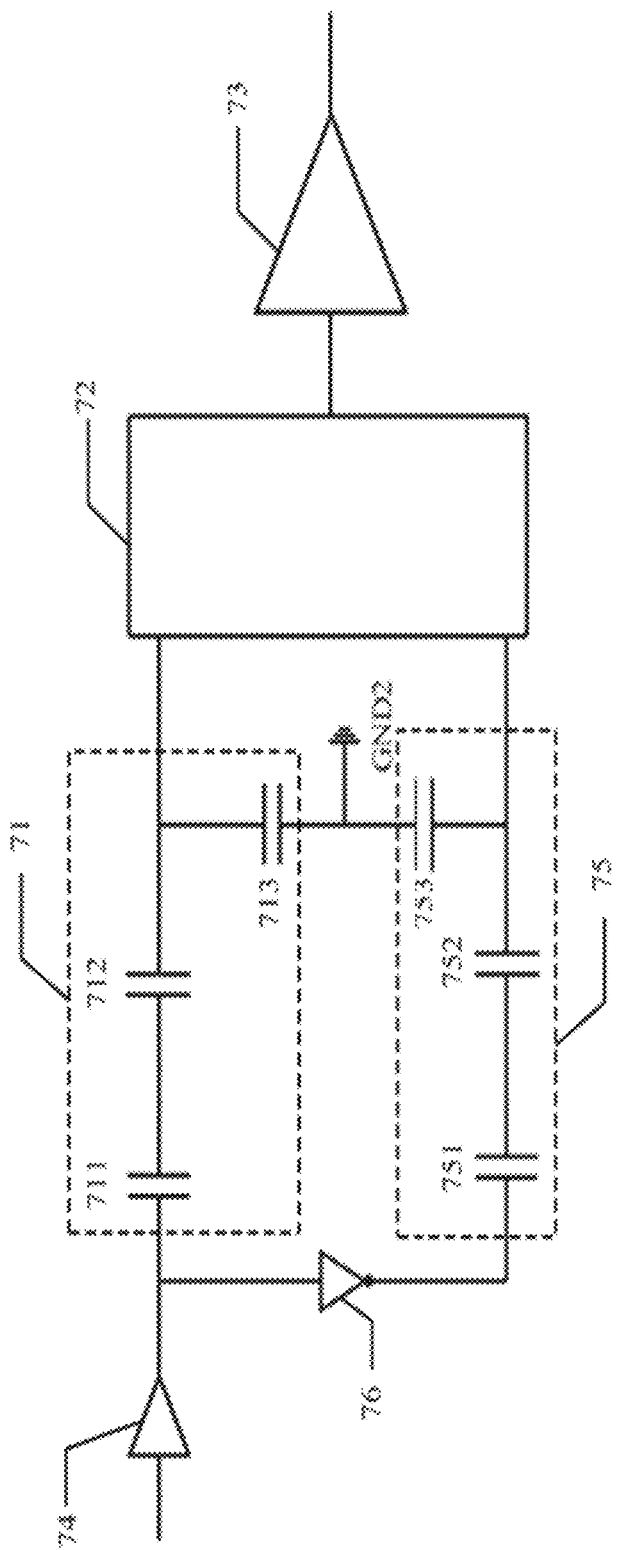
FIG. 7 schematically illustrates a diagram of an isolation circuit according to another embodiment of the present disclosure.

Referring to FIG. 7, FIG. 7 schematically illustrates a diagram of an isolation circuit according to another embodiment of the present disclosure. The isolation circuit includes: an isolation module includes a primary isolation branch 71 and a common-mode branch 75, a latch 72, an amplifier 73, a buffer 74 and an inverter 76. The primary isolation branch 71 includes a first division capacitor 713 and the common-mode branch 75 includes a second division capacitor 753.

The main difference from the isolation circuit as shown in FIG. 5 lies in that a first primary isolation capacitor 711 and a second primary isolation capacitor 712 in series constitute a primary isolation capacitor, a first auxiliary isolation capacitor 751 and a second auxiliary isolation capacitor 752 in series constitute an auxiliary isolation capacitor. Other components are similar to the isolation circuit as shown in FIG. 5 and are not described in detail hereinafter.

In some embodiment, the first primary isolation capacitor 711 and the second primary isolation capacitor 712 are disposed in different die, and the first auxiliary isolation capacitor 751 and the second auxiliary isolation capacitor 752 are disposed in different dies. For example, the first primary isolation capacitor 711 and the first auxiliary isolation capacitor 751 may be disposed on the first die, and the second primary isolation capacitor 712 and the second auxiliary isolation capacitor 752 may be disposed on the second die. Therefore, the isolation circuit could have a higher isolation voltage and the isolation circuit can be designed with a more flexibility.

In some embodiment, the first primary isolation capacitor 711 and the second primary isolation capacitor 712 have a same capacitance value; and the first auxiliary isolation capacitor 751 and the second auxiliary isolation capacitor 752 have a same capacitance value.

The isolation circuits in the above embodiments provides a one channel isolation circuit. In some embodiment, there may provide two or more channels, so that data transmitting rate can be improved.

In a multi-channel isolation circuit, the isolation module includes two or more primary isolation branches corresponding to the two or more channels respectively, and each of which includes a primary isolation capacitor and a first division capacitor in series. The latch module includes two or more latches, corresponding to the two or more primary isolation branches respectively. The amplifier module includes two or more amplifiers, corresponding to the two or more latches respectively. The buffer module includes two or more buffers, corresponding to the two or more primary isolation branches respectively.

In some embodiment, the isolation module further includes a common-mode branch to reduce a common-mode noise, and to output a common-mode signal to each of the two or more latches correspondingly. All channels share the same common-mode branch.

In some embodiment, the common-mode branch includes an auxiliary isolation capacitor and a second division capacitor in series. a first plate of the auxiliary isolation capacitor is coupled with a ground signal of the first die, a first plate of each of the two or more of division capacitors and a first plate of the second division capacitor are coupled with a ground signal of the second die, and a second plate of the second division capacitor is coupled with an input terminal of each of the two or more latches correspondingly.

Figure 8:
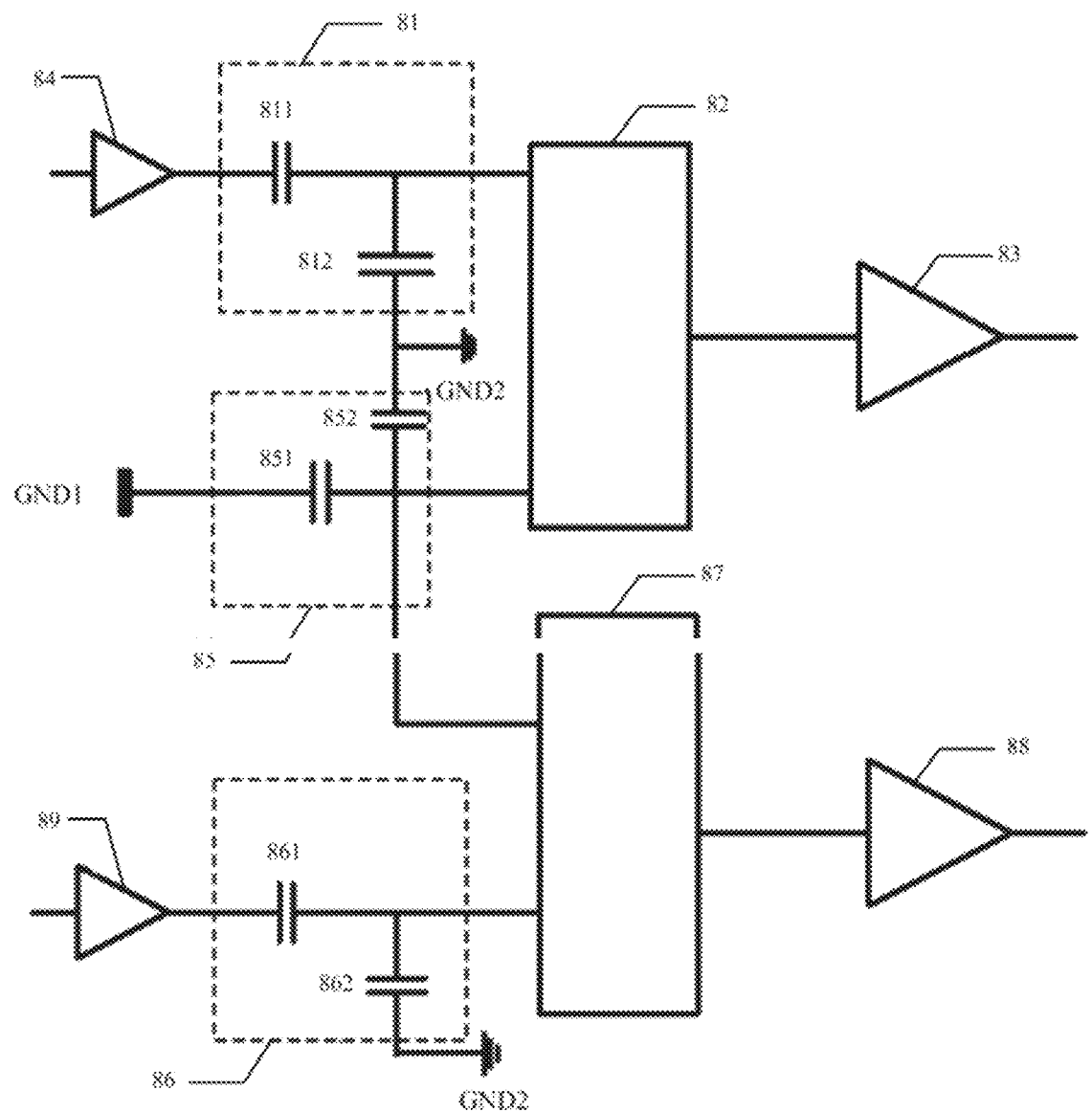
FIG. 8 schematically illustrates a diagram of an isolation circuit according to another embodiment of the present disclosure.

Referring to FIG. 8, FIG. 8 schematically illustrates a diagram of an isolation circuit according to another embodiment of the present disclosure. The isolation circuit includes an isolation module including a first primary isolation branch 81 and a common-mode branch 85, a first latch 82, a first amplifier 83, and a first buffer 84. The primary isolation branch 81 includes a first primary isolation capacitor 811 and a first division capacitor 812 in series. The common-mode branch includes an auxiliary capacitor 851 and a second division capacitor 852 in series.

The isolation circuit as shown in FIG. 8 further includes a second channel including a second primary isolation branch 86, a second latch 87, a second amplifier 88, and a second buffer 89. The primary isolation branch 86 includes a second primary isolation capacitor 861 and a third division capacitor 862 in series. Therefore, the isolation circuit as shown in FIG. 8 may transmit signals through the first channel of the first primary isolation branch 81 and the common-mode branch 85, and through the second channel of the second primary isolation branch 86 and the common-mode branch 85 at a same time.

Specifically, the primary isolation capacitor 861 includes a first plate coupled with an output terminal of the buffer 89, and a second plate coupled with a second plate of the first division capacitor 862 and a first input terminal of the latch 87. A first plate of the first division capacitor 862 receive a ground signal from second die GND2. The latch 87 includes a second plate to receive a common-mode signal from the common-mode branch 85 and an output terminal to output a latched signal to the amplifier 88. Capacitance values of the capacitor 811, the capacitor 812, the capacitor 851, the capacitor 852, the capacitor 861 and the capacitor 862 are denoted by C1-C6 respectively.

In some embodiment, a capacitance ratio between the primary isolation capacitors and corresponding division capacitors in each primary isolation branch is equal to a capacitance ratio between an auxiliary isolation capacitor and a corresponding second division capacitor. That is to say, in the isolation circuit as shown in FIG. 8, C1:C2=C3:C4=C5:C6.

In some embodiment, the primary isolation capacitors in the two or more primary isolation branches and the auxiliary isolation capacitor 851 have a same capacitance value; and the first division capacitors in the two or more primary isolation branches and the second division capacitor 852 have a same capacitance value. That is to say, in the isolation circuit as shown in FIG. 8, C1=C3=C5; C2=C4=C6.

In some embodiment, the isolation circuit may further include more channels.

Since capacitors are silicon dioxide devices, there is no aging problem of the optocoupler. Further, the isolation circuit provides isolation by means of isolating capacitors, so that the input signal can directly pass through an isolation medium. Therefore, the isolation circuit has a stable quality, a long service life and a low cost.

Figure 9:
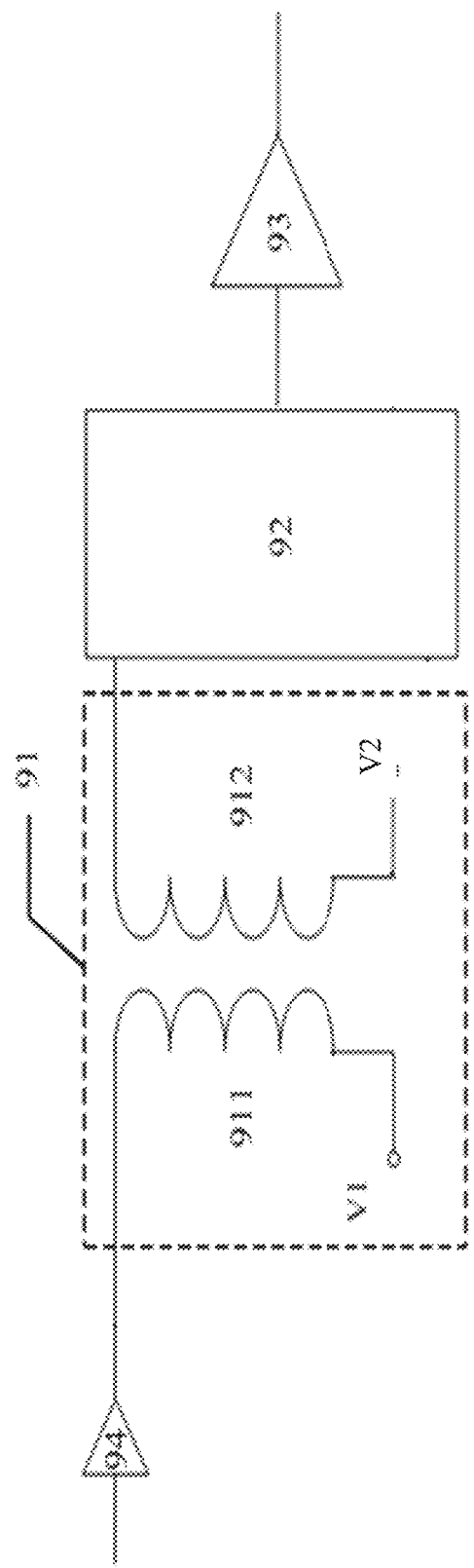
FIG. 9 schematically illustrates a diagram of an isolation circuit according to another embodiment of the present disclosure.

Referring to FIG. 9, FIG. 9 schematically illustrates a diagram of an isolation circuit according to another embodiment of the present disclosure. The isolation circuit includes an isolation module including a primary isolation branch 91, a latch 92, an amplifier 93 and a buffer 94. The isolation module shown in FIG. 8 includes a first inductor 911 and a second inductor 912. There is no electrical connect between the first inductor 911 and the second inductor 912, and signals are transmitted though a magnetic field, so that an electrical isolation can be realized. The latch 92 is required to latch the isolation signal at a certain level and outputs a latched signal. The isolation signal in a inductive isolation module is a current signal.

The first inductor 911 includes a first terminal coupled with an output terminal of the buffer 94 to receive the input signal, and a second terminal to coupled with a fixed voltage V1. The second inductor 912 includes a first terminal coupled with a first input terminal of the latch 92 to output the isolated signal to the latch module, and a second terminal coupled with the fixed voltage V2. The amplifier 93 are similar to that in the isolation circuit above and are not described in detail hereinafter.

Figure 10:
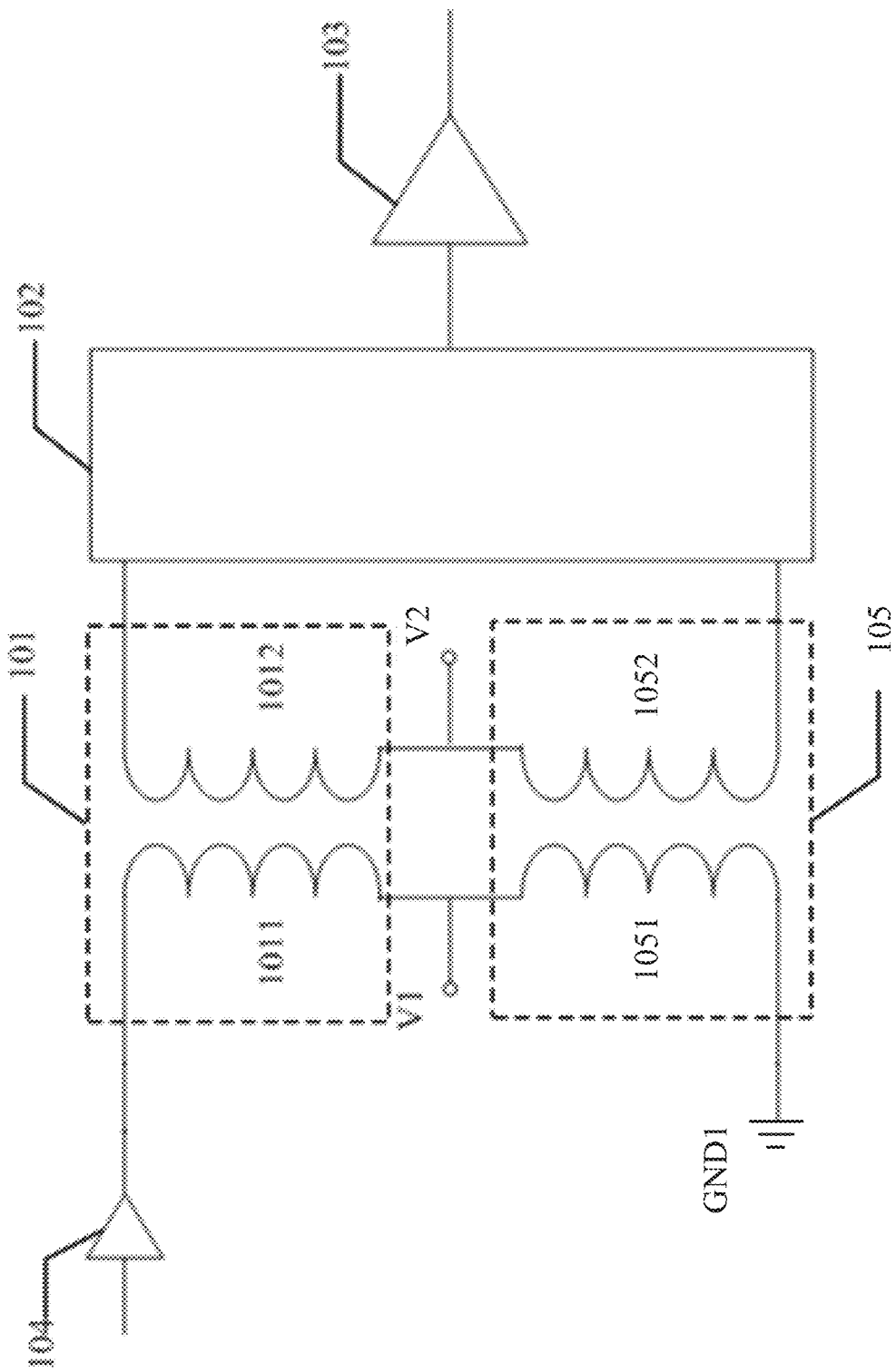
FIG. 10 schematically illustrates a diagram of an isolation circuit according to another embodiment of the present disclosure.

Referring to FIG. 10, FIG. 10 schematically illustrates a diagram of an isolation circuit according to another embodiment of the present disclosure. The isolation circuit includes an isolation module including a primary isolation branch 101 and a common-mode branch 105, a latch 102, an amplifier 103, and a buffer 104. The primary isolation branch 101 includes a first inductor 1011 and a second inductor 1012.

Compared with FIG. 9, the isolation circuit in FIG. 10 further includes the common-mode branch 105. The common-mode branch 105 is coupled to a ground signal GND1 of the first die and an input terminal of the latch 102 to reduce a common-mode noise on the first die and the second die, and to output a common-mode signal to the latch 102. Specifically, the common-mode branch 116 includes a third inductor 1051, and a fourth inductor 1052. The third inductor 1051 includes a first terminal to receive the ground signal GND1 of the first die, and a second terminal coupled with the fixed voltage V1. The fourth inductor 1052 includes a first terminal to output a common-mode signal to the latch 102, and a second terminal coupled with the fixed voltage V2. In some embodiment, the latch 102 may be a current latch. Other components are similar to the isolation circuit as shown in FIG. 9 and are not described in detail hereinafter.

Figure 11:
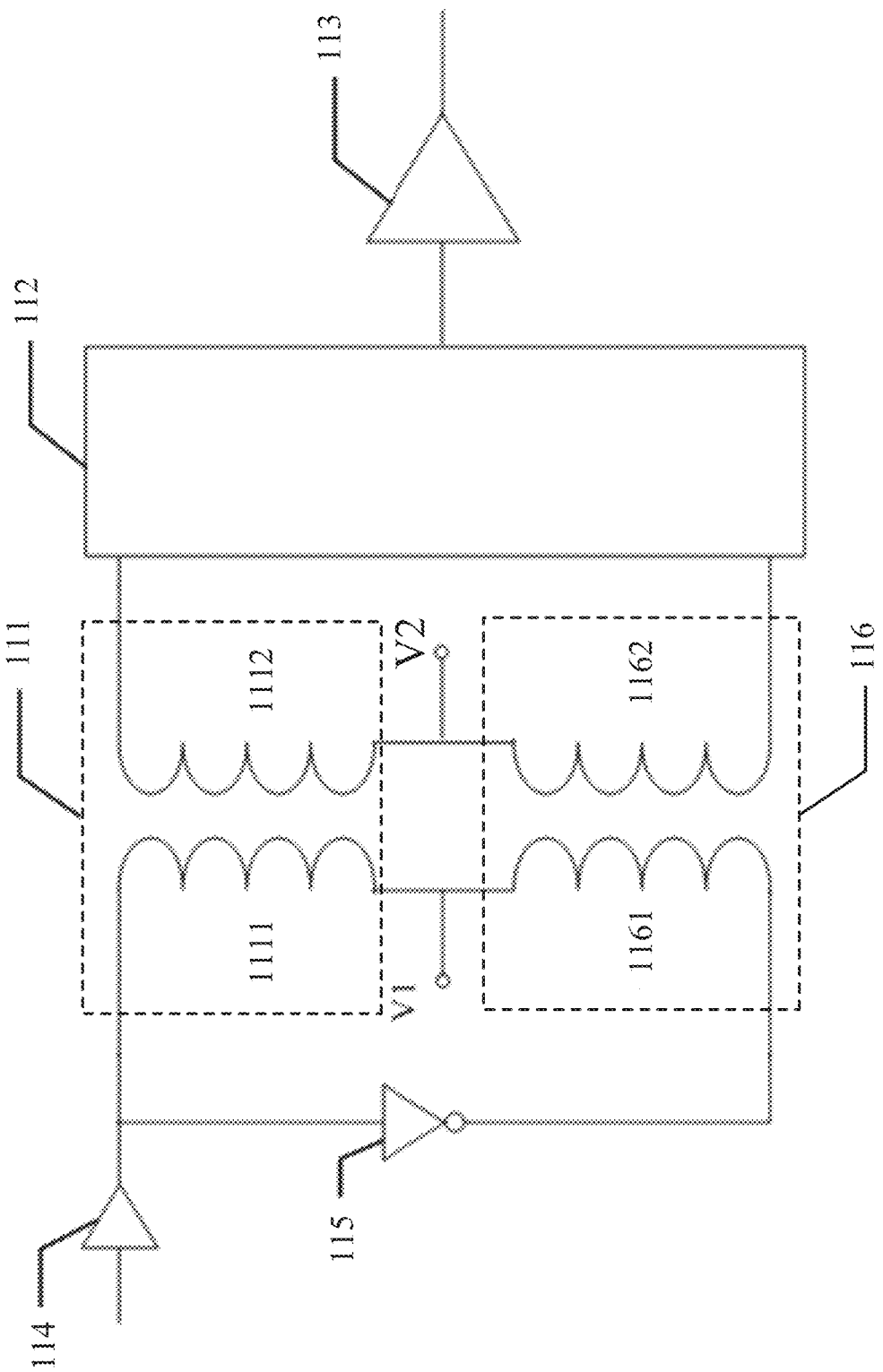
FIG. 11 schematically illustrates a diagram of an isolation circuit according to another embodiment of the present disclosure.

Referring to FIG. 11, FIG. 11 schematically illustrates a diagram of an isolation circuit according to another embodiment of the present disclosure. The isolation circuit includes an isolation module including a primary isolation branch 111 and a common-mode branch 116, a latch 112, an amplifier 113, a buffer 114 and an inverter 115. The primary isolation branch 111 includes a first inductor 1111 and a second inductor 1112.

Compared with FIG. 9, the isolation circuit in FIG. 11 further includes the inverter 115 and the common-mode branch 116. The inverter 115 is configured to invert the input signal to an inverted input signal, and includes an input terminal coupled with the input signal, and an output terminal to output the inverted input signal. The common-mode branch 116 is to reduce a common-mode noise on the first die and the second, and to output a common-mode signal to the latch 112. Specifically, the common-mode branch 116 includes a third inductor 1161, and a fourth inductor 1162. The third inductor 1161 includes a first terminal to receive the inverted input signal, and a second terminal coupled with the fixed voltage V1. The fourth inductor 1162 includes a first terminal to output a common-mode signal to the latch 112, and a second terminal coupled with the fixed voltage V2. Other components are similar to the isolation circuit as shown in FIG. 9 and are not described in detail hereinafter.

In some embodiment, the fixed voltage V1 and the fixed voltage V2 may be VDD or ½ VDD or other values.

In some embodiment, the latch module includes at least one latch, each of which has a flipping voltage 10 mV-60 mV or a flipping current at 30 uA-1 mA corresponding to voltage signals or current signals respectively.

Figure 12:
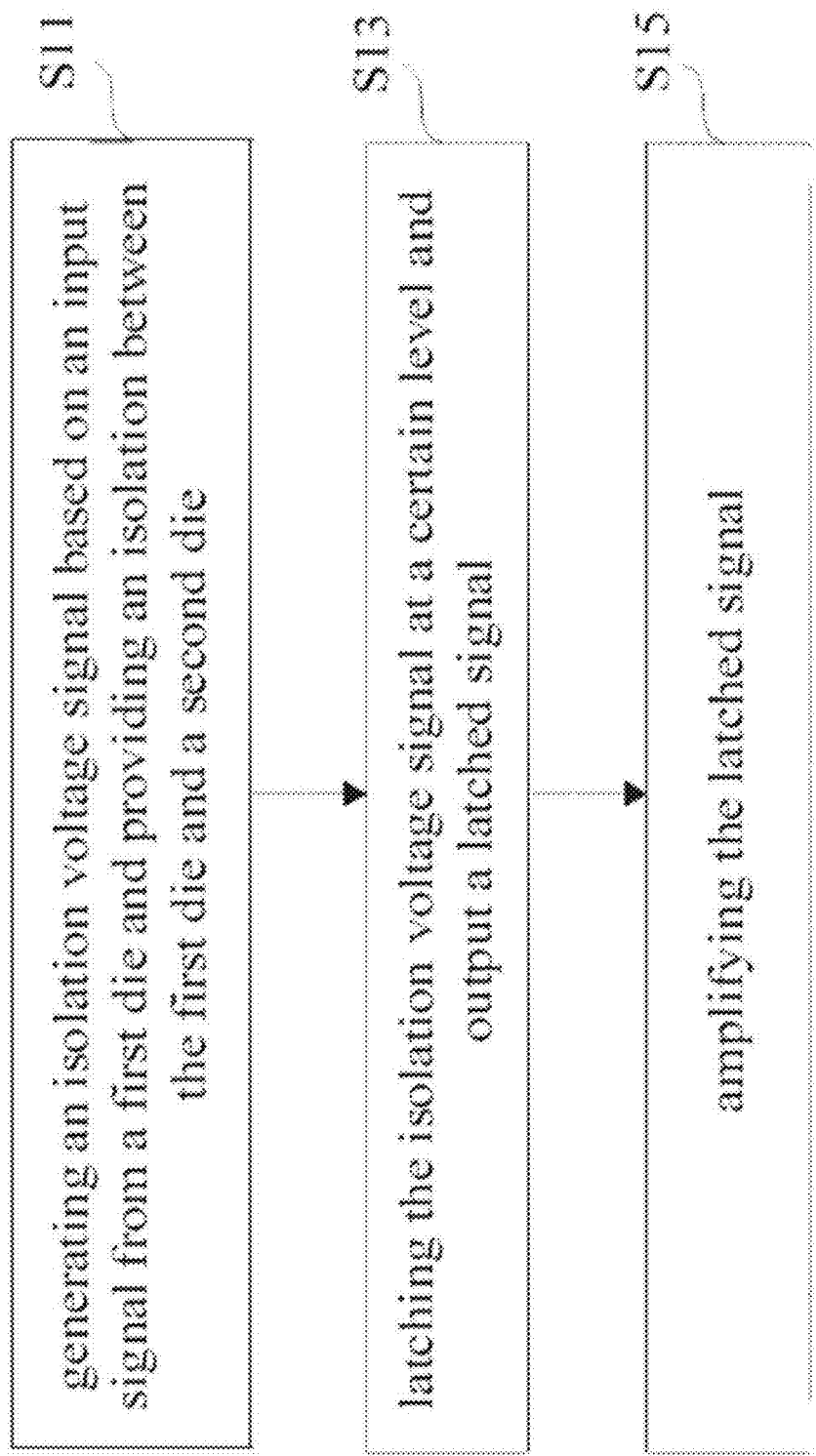
FIG. 12 schematically illustrates a flowchart of a method for providing isolation between two dies according to an embodiment of the present disclosure.
Figure 13:
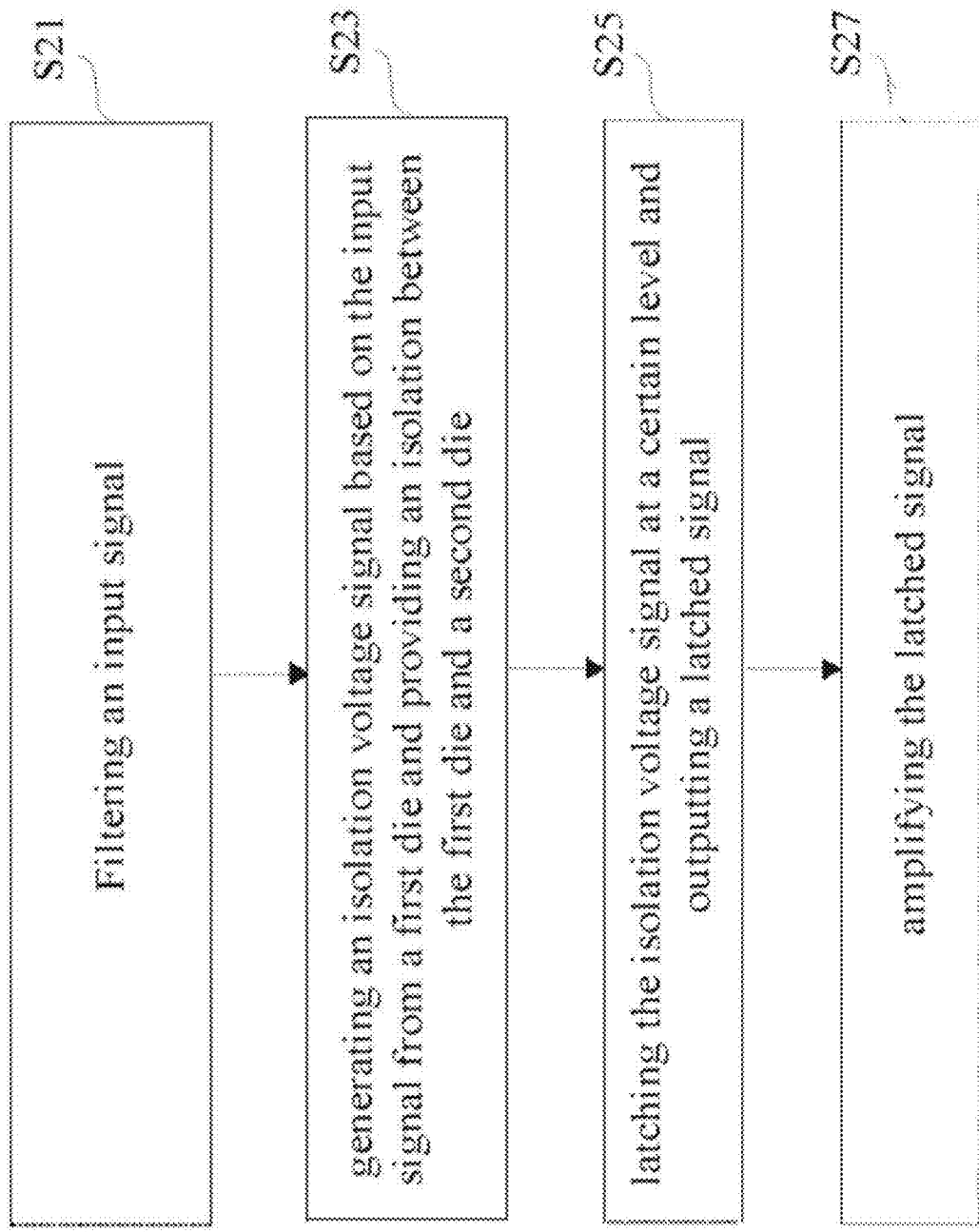
FIG. 13 schematically illustrates a flowchart of a method for providing isolation between two dies according to another embodiment of the present disclosure.

Embodiments of the present disclosure further provides a method for providing isolation between two dies. FIG. 12 schematically illustrates a flowchart of a method for providing isolation between two dies according to an embodiment of the present disclosure; and FIG. 13 schematically illustrates a flowchart of a method for providing isolation between two dies according to another embodiment of the present disclosure.

As shown in FIG. 12, and the method includes S11, S13 and S15.

In S11: an isolation signal is generated based on an input signal from a first die and providing isolation between the first die and a second die, wherein the isolation signal is smaller than the input signal in amplitude.

In S13: the isolation signal is latched at a certain level to form a latched signal.

In S15: the latched signal is amplified.

In some embodiment, the method further includes a filtering step. As shown in FIG. 13, the method for isolating two dies including S21, S23, S25, and S27. In S21, an input signal is filtered before the isolation voltage is generated. Other steps of S23, S25, and S27 are similar to corresponding steps in FIG. 12. The method in FIGS. 12 and 13 may be implemented in any system including the isolation circuit according to an embodiment of the present disclosure. More details of the method may refer to the description of the isolation circuit, and are not described in detail hereinafter.

Figure 14:
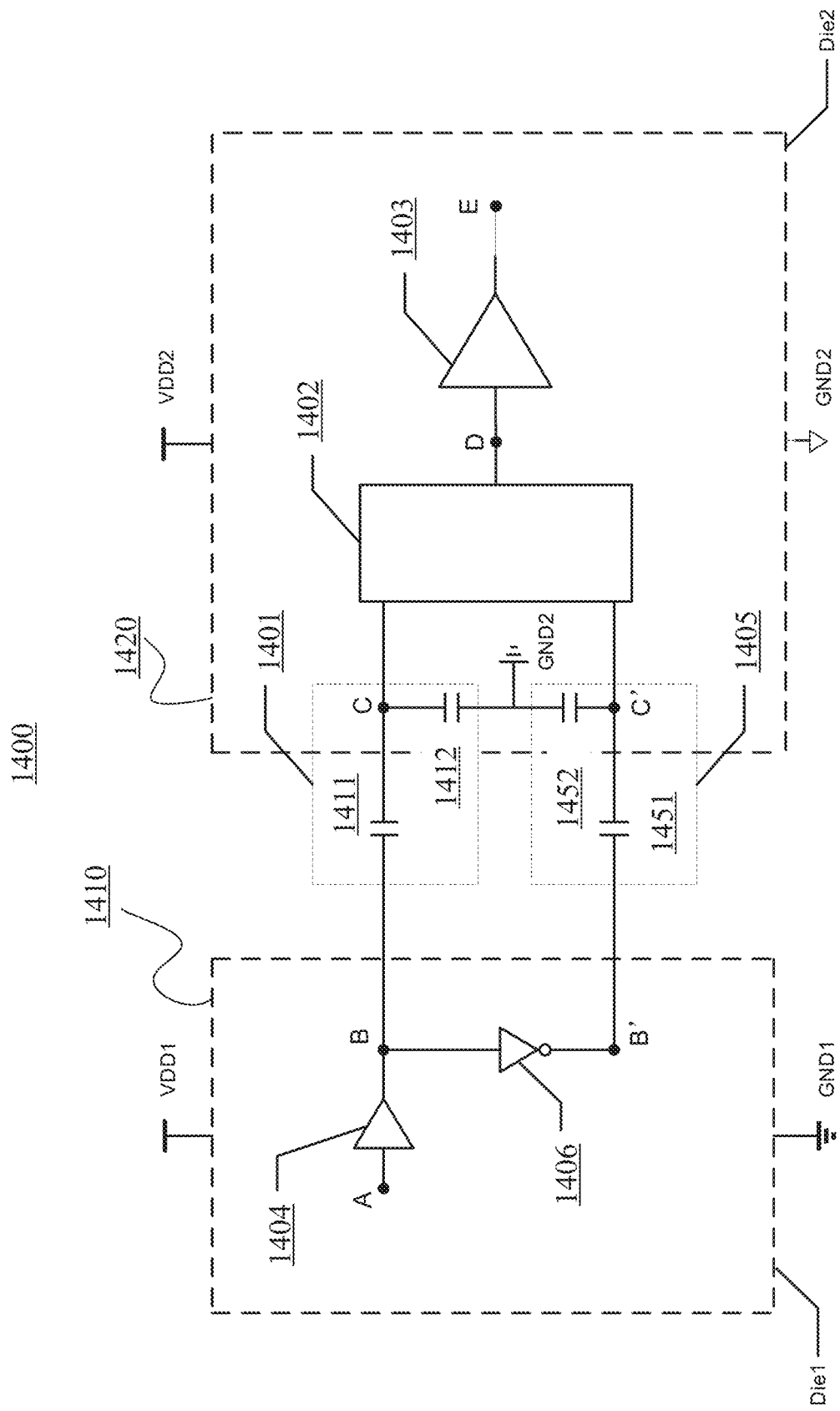
FIG. 14 schematically illustrates a diagram of an isolation circuit according to an embodiment of the present disclosure.

FIG. 14 schematically illustrates a diagram of an isolation system 1400 according to an embodiment of the present disclosure. This diagram is merely an example, which should not unduly limit the scope of the claims. One of ordinary skill in the art would recognize many variations, alternatives, and modifications. As shown in FIG. 14, an isolation system 1400 includes two stages: input stage 1410 and isolation stage 1420. The input stage 1410 converts a single input to a pair of differential inputs. Isolation stage 1420 includes first input buffer 1401 and a second input buffer 1405, a latch 1402, and an amplifier 1403. For example, first input buffer 1401 may be referred to as a first isolation module. Second input buffer 1405 may be referred to as a second isolation module. First isolation module 1401 may include a primary isolation capacitor 1411 and a first division capacitor 1412 in series. In some cases, latch 1402 may be referred to as a latch circuit.

First input buffer 1401 is configured to receive a first differential signal (i.e., from node B) and to provide a second differential signal (at node "C"). For example, the first differential signal may be characterized by a first magnitude, the second differential signal may be characterized by a second magnitude (e.g., as measured in voltage amplitude), and the first magnitude may be greater than the second magnitude. It is to be appreciated that one of the functionalities of isolation system 1400 is to accommodate different voltage levels between different circuits. In some embodiments, the transmitter is configured on a first die (e.g., Die 1) and coupled to a first ground terminal (e.g., GND1). First input buffer 1401 as shown is coupled to a second ground terminal (e.g., GND2). According to some embodiments, second input buffer 1405 may be configured to receive a third differential signal (from node B') and to provide a fourth differential signal (at node C'). For example, the first differential signal and the third differential signal may constitute a pair of differential signals. Similarly, the second differential signal and the fourth differential signal may constitute a pair of differential signals. Second input buffer 1405 is coupled to the second ground terminal (e.g., GND2). As explained below, a difference between the first ground GND1 and the second ground GND2 may create common-mode transient problems, which need to be addressed (see FIG. 17 and its description below).

In some embodiments, primary isolation capacitor 1411 in first isolation module 1401 may include a first plate configured to receive the first input signal (i.e., the first differential signal), and a second plate coupled to a first input terminal of latch 1402. First division capacitor 1412 may include a first plate coupled to the second ground terminal (e.g., GND 2), and a second plate coupled to the second plate of primary isolation capacitor 1411 and the first input terminal of latch 1402. For example, primary isolation capacitor 1411 of first isolation module 1401 may be referred to as a first capacitor, and first division capacitor 1412 of first isolation module 1401 may be referred to as a second capacitor. In some embodiments, the first capacitor may be directly coupled to the first differential signal, and the second capacitor may be directly coupled to the second ground terminal (e.g., GND 2).

In some embodiments, second isolation module 1405 may be configured to generate a second isolation signal (i.e., the fourth differential signal) based on the second input signal (i.e., the third differential signal) and to provide isolation between the first die and the second die.

According to some embodiments, the first input signal and the second input signal may be configured as a differential pair. Therefore, the first isolation signal (i.e., the second differential signal) and the second isolation signal (i.e., the fourth differential signal) may also be configured as a differential pair. When the common-mode noise increases significantly, for example, when it reaches the same level as the desired signal (for example, 100V/ns), the noise signal may have a significant effect on the desired signal and may result in problems such as signal distortion or loss. The first and the second input signals being configured as a differential pair may reduce the common-mode noise.

As a mechanism of physical isolation, the isolation circuit may be configured to separate dies. For example, the isolation circuit may include a transmitter and a receiver, and the transmitter is configured on the first die) and the receiver is configured on the second die. The transmitter circuit operates on a first supply voltage VDD1 and a first reference ground GND1, and the receiver circuit operates on a second supply voltage VDD2 and a second reference ground GND2. The transmitter may convert an input signal into a digital signal as the first input signal (i.e., the first differential signal) and drive first isolation module 1401. Inverter 1406 may be configured to invert the first input signal and generate a second input signal (i.e., the third differential signal), and drive second isolation module 1405. The first input signal and the second input signal may be configured as a pair of differential signals, which reduces common-mode transient during signal transmission.

In some embodiments, second isolation module 1405 may include an auxiliary isolation capacitor 1451, and a second division capacitor 1452 configured in series. Auxiliary isolation capacitor 1451 may include a first plate configured to receive the second input signal (i.e., the third differential signal), and a second plate coupled to a second input terminal of latch 1402. Second division capacitor 1452 may include a first plate coupled to the second ground terminal (e.g., GND 2), and a second plate coupled to the second plate of auxiliary isolation capacitor 1451 and the second input terminal of latch 1402. For example, auxiliary isolation capacitor 1451 of second isolation module 1405 may also be referred to as a third capacitor, and second division capacitor 1452 may also be referred to as a fourth capacitor. In some embodiments, the third capacitor may be directly coupled to the third differential signal, and the fourth capacitor may be directly coupled to the second ground terminal (e.g., GND 2).

Because of the voltage-dividing ability of capacitors, the first isolation signal may be smaller than the first input signal in magnitude, and the second isolation signal may be smaller than the second input signal in magnitude. For example, the first differential signal may be characterized by a first magnitude, the second differential signal may be characterized by a second magnitude, and the first magnitude may be greater than the second magnitude. Similarly, the third differential input signal may be characterized by a third magnitude, the fourth differential signal may be characterized by a fourth magnitude, and the third magnitude may be greater than the fourth magnitude. That is to say, levels of the isolation signals at nodes C and C' may be lower than levels of the input signals at nodes B and B' in amplitude, respectively. Primary isolation capacitor 1411 and auxiliary isolation capacitor 1451 may be configured to provide isolation between the first die and the second die. The isolation voltage has a wide range and may be up to 20,000V.

In some embodiments, primary isolation capacitor 1411 and auxiliary isolation capacitor 1451 may have various arrangements. In some embodiments, at least one of primary isolation capacitor 1411 and auxiliary isolation capacitor 1451 may be configured on the first die or the second die. The flexible arrangements of primary isolation capacitor 1411 and auxiliary isolation capacitor 1451 are beneficial to the circuit design and digital isolation.

In some embodiments, the capacitance values of primary isolation capacitor 1411 and auxiliary isolation capacitor 1451 can be flexibly designed based on the requirements of the integrated circuits, usually, their capacitance values are less than 100 fF, and it is not meant to be limiting. According to some embodiments, the capacitance values of first division capacitor 1412 and second division capacitor 1452 may mainly comprise an input parasitic capacitance of the receiver circuit, usually, their capacitance values are less than 1 pF. The larger the capacitance of each capacitor, the smaller the voltage input to latch 1402.

In some embodiments, if capacitance values of primary isolation capacitor 1411, first division capacitor 1412, auxiliary isolation capacitor 1451, and second division capacitor 1452 are denoted by C1, C2, C3, and C4, respectively, a capacitance ratio between primary isolation capacitor 1411 and first division capacitor 1412 may be equal to a capacitance ratio between auxiliary isolation capacitor 1451 and second division capacitor 1452 (i.e., C1:C2=C3:C4). The capacitance ratio between each capacitor may be associated with the input signal(s) of latch 1402.

In some embodiments, primary isolation capacitor 1411 and auxiliary isolation capacitor 1451 may have the same capacitance value; first division capacitor 1412 and second division capacitor 1452 may have the same capacitance value (i.e., C1=C3; C2=C4), which are beneficial to mass production, reduction of manufacturing cost, and system stability.

In some embodiments, the input signal is filtered before the input signal is transmitted to the isolation module. As shown in FIG. 14, buffer 1404 may include an input terminal configured to receive an input signal from the transmitter, and an output terminal configured to perform filtering on the input signal and to output a filtered signal to the isolation module (e.g., first input buffer 1401 and/or second input buffer 1405). Buffer 1404 may be configured on the first die. It should be noted that buffer 1404 is not a compulsory component in the isolation circuit.

In some embodiments, inverter 1406 may be configured to invert the input signal and output the inverted signal. For example, inverter 1406 generates an inverted signal at node B', which forms as the second signal of the differential pair (the first signal is at node B). For example, if the first stage 1410 is already receiving differential input signals as its inputs, there is no need for inverter 1406, and a second buffer (e.g., a diode similar to buffer 1404) may be configured in the place of inverter 1406. Inverter 1406 may include an input terminal configured to receive the input signal (i.e., the first differential signal), and an output terminal configured to output the inverted signal (i.e., the third differential signal). According to some embodiments, the input terminal of inverter 1406 may be coupled to first isolation module 1401, and the output terminal of inverter 1406 may be coupled to second isolation module 1405. In some cases, the input terminal of inverter 1406 may be coupled to second isolation module 1405, and the output terminal of inverter 1406 may be coupled to first isolation module 1401. In some embodiments, inverter 1406 may be configured on the first die. According to some embodiments, inverter 1406 may be configured to generate the third differential signal.

In some embodiments, latch 1402 stores isolation signals (e.g., differential signals at nodes C and C') at a predetermined level (or within a certain range) for a time interval and output a latched signal. Latch 1402 may include, but is not limited to, a first input terminal configured to receive the first isolation signal, a second input terminal configured to receive a second isolation signal, and an output terminal configured to output the latched signal. In some cases, latch 1402 may have a small flipping voltage to recognize digital signals with small amplitude differences, so that even a small signal difference can be recognized. According to some embodiments, latch 1402 comprises a voltage latch. For example, latch 1402 may also be referred to as a latch circuit.

In some embodiments, amplifier 1403 may be configured to amplify the latched signal. Amplifier 1403 is coupled to latch/the latch circuit 1402. For example, amplifier 1403 is configured to provide amplification at a predetermined range; in certain cases, attenuation, instead of amplification, is needed.

Figure 15:
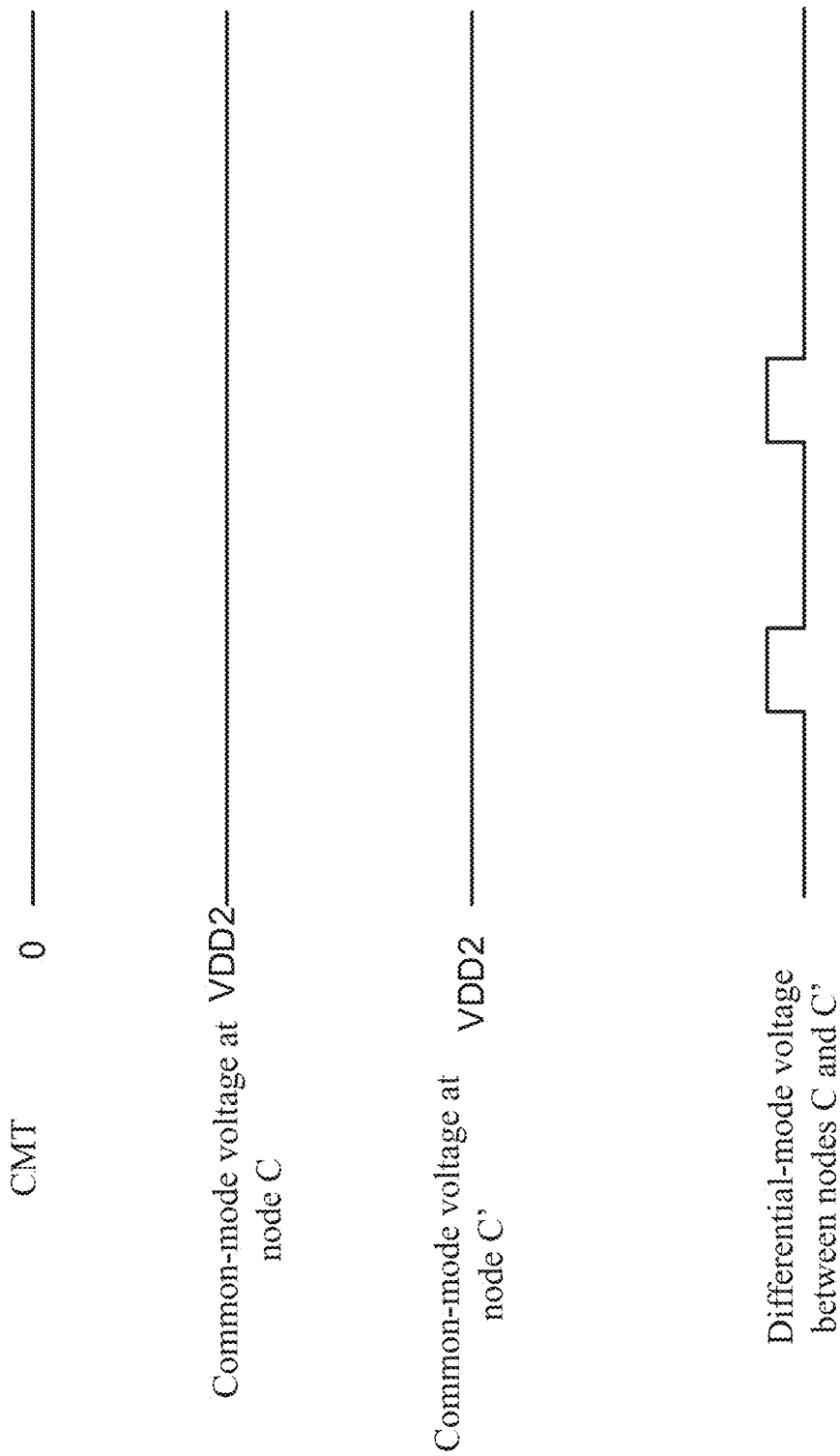
FIG. 15 schematically illustrates a timing diagram of the isolation circuit shown in FIG. 14 when there is no CMT.

FIG. 15 schematically illustrates a timing diagram of the isolation circuit shown in FIG. 14 when there is no common-mode transient (CMT) between the first die and the second die. As explained above, the first die and the second die are configured on different supply voltages and are connected to separate ground terminals. According to some embodiments, when there is no CMT between the first die and the second die, the common-mode voltage at node C may be the same as the supply voltage of the second die (e.g., VDD2), and common-mode voltage at node C' may also be the same as the supply voltage of the second die (e.g., VDD2). There may be no common-mode current caused by CMT between the first die and the second die. The differential-mode voltage between nodes C and C' may be relatively low, therefore, levels of isolation signals output to latch circuit 1402 may be relatively low correspondingly.

Figure 16:
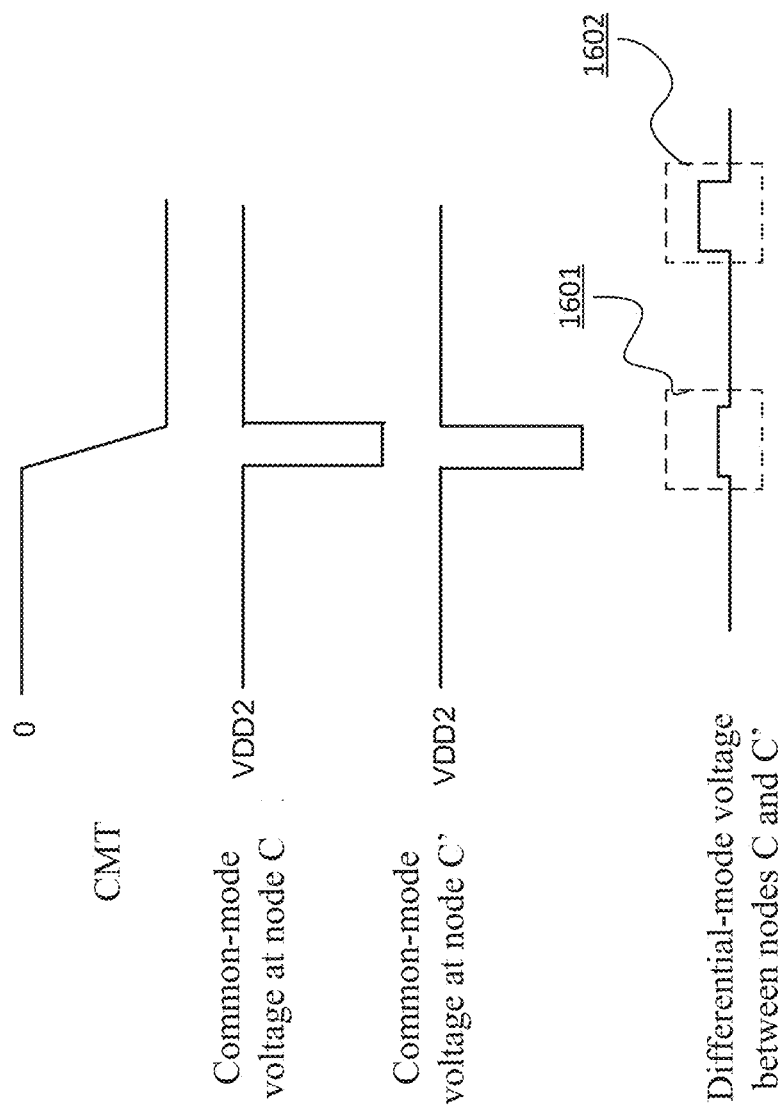
FIG. 16 schematically illustrates a timing diagram of the isolation circuit shown in FIG. 14 when CMT occurs.

FIG. 16 schematically illustrates a timing diagram of the isolation circuit shown in FIG. 14 when there is a CMT between the first die and the second die. As an example, when CMT occurs between the first die and the second die, a common-mode current generated by CMT flows through the isolation barrier (e.g., the first input buffer and/or the second input buffer). As shown in FIG. 16, the common-mode voltages at nodes C and C' may suddenly change significantly during CMT, which may result in signal transmission errors. As an example, errors tend to occur at region 1601 as shown. For example, when there is no CMT, signal transmission is not disrupted, as shown at region 1602. The change of common-mode voltage $\Delta V_{cm}$ at the input terminals of latch 1402 can be expressed by the following equation:

$$\Delta V_{cm} = I_{cm} \times R_{cm}$$

where $I_{cm}$ is a common-mode current generated due to CMT, $R_{cm}$ is a common-mode input impedance of latch 1402.

In practice, a common-mode impedance mismatch between the two input terminals of latch 1402 may convert the common-mode voltage into a differential-mode voltage that leads to signal transmission errors. The differential-mode voltage $V_{dm}$ caused by the common-mode impedance mismatch $Rmis_{cm}$ can be expressed by the following equation:

$$V_{dm} = I_{cm} \times Rmis_{cm}$$

To improve the CMTI of the isolation circuit, the latch should have a low common-mode input impedance value $R_{cm}$, and low common-mode impedance mismatch $Rmis_{cm}$.

Figure 17:
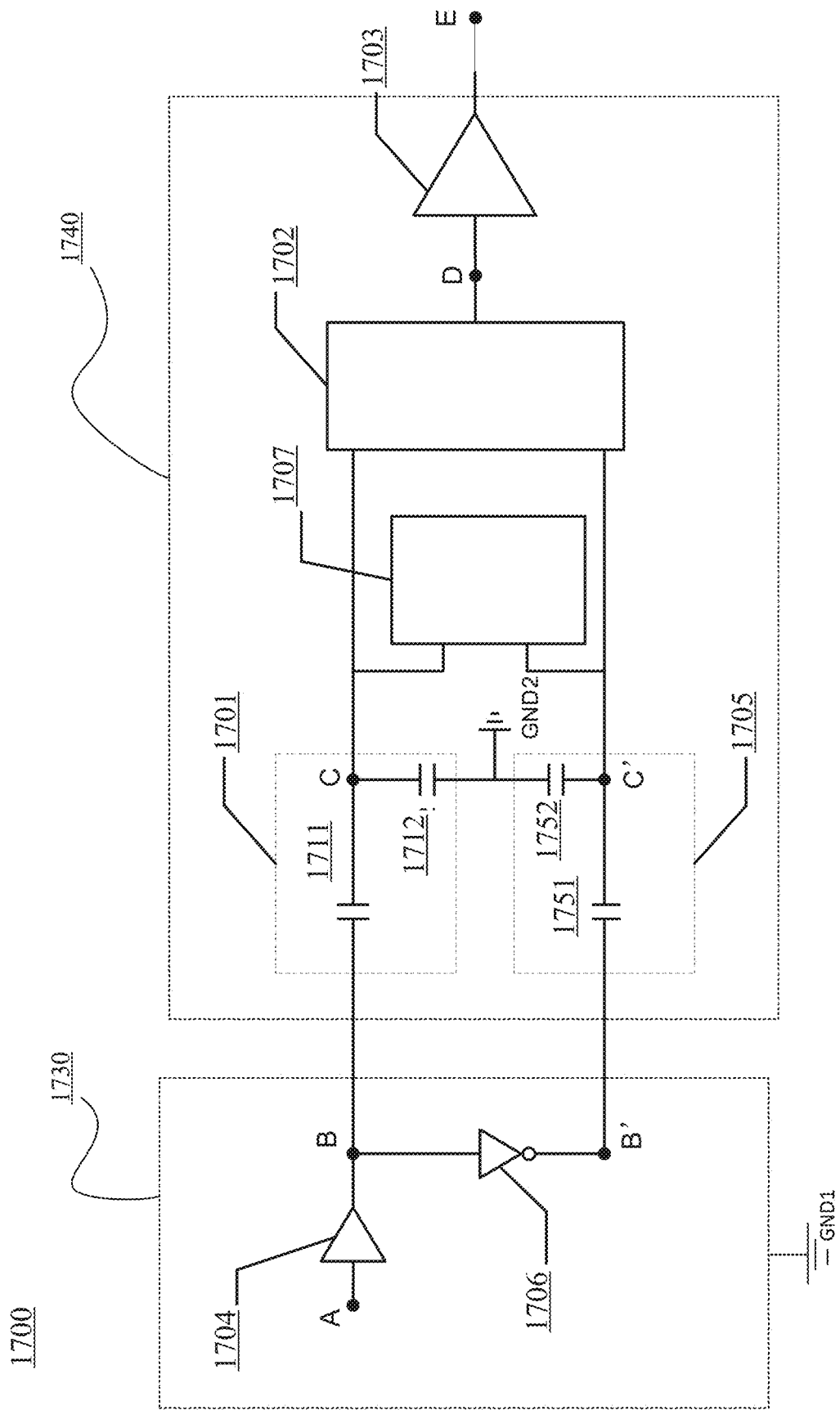
FIG. 17 schematically illustrates a diagram of an isolation circuit according to another embodiment of the present disclosure.

FIG. 17 schematically illustrates a simplified diagram of an isolation circuit according to embodiments of the present disclosure. This diagram is merely an example, which should not unduly limit the scope of the claims. One of ordinary skill in the art would recognize many variations, alternatives, and modifications. As shown, the isolation circuit includes a buffer 1704, an inverter 1706, a first isolation module 1701, a second isolation module 1705, a common-mode module 1707, a latch 1702, and an amplifier 1703. Common-mode module 1707 may be coupled to latch 1702 in parallel. In some cases, latch 1702 may be referred to as a latch circuit.

For example, first isolation module 1701 may be referred to as a first input buffer. Second isolation module 1705 may be referred to as a second input buffer. Differential input signals are configured at nodes B and B'. First isolation module 1701 receives the first differential signal at node B. The output of first isolation module 1701 is configured at node C. For example, differential signals are received from a transmitter. Second isolation module 1705 receives the second differential signal at node B'. The output of second isolation module 1705 is configured at node C'.

As explained above, an objective of the isolation circuit is to accommodate different signal voltage levels that exist among different electrical components and circuits. The first differential signal (e.g., at node B) is characterized by a first magnitude and the second differential signal (e.g., at node C) is characterized by a second magnitude. For example, the first magnitude may be greater than the second magnitude. It is to be appreciated that input buffers 1701 and 1702 are configured to provide accommodation for voltage level differences.

As an example, sections 1730 and 1740 are configured on two different dies, each has its own ground terminal (thus potentially differential biases). In some embodiments, the transmitter may be configured on a first die and coupled to a first ground terminal. First input buffer 1701 may be coupled to a second ground terminal (e.g., GND2). According to some embodiments, second input buffer 1705 may be configured to receive a third differential signal from the transmitter and to provide a fourth differential signal. For example, the third differential input signal may be characterized by a third magnitude, the fourth differential signal may be characterized by a fourth magnitude, and the third magnitude may be greater than the fourth magnitude. Second input buffer 1705 may be coupled to the second ground terminal GND2.

For example, common-mode module 1707 comprises a common-mode circuit. The common-mode circuit may be coupled to a bias voltage (e.g., $V_{bias}$) and may comprise a resistor pair. The common-mode circuit may be configured to reduce a common-mode transient voltage, the common-mode transient voltage may be associated with a voltage differential between the GND1 and GND2, respectively configured for two different dies. Common-mode circuit 1707 may be configured on a second die. In some embodiments, the transmitter and common-mode circuit 1707 being configured on different dies may introduce a common-mode transient voltage, which could disrupt effective differential signal transmission. Common-mode circuit 1707 is configured to reduce the common-mode transient voltage, thereby reducing or eliminating such disruption, and improving signal transmission. First isolation module 1701, second isolation module 1705, latch 1702, amplifier 1703, buffer 1704, and inverter 1706 are similar to the above circuits and are not described in detail hereafter.

In some embodiments, common-mode module 1707 may include but is not limited to, a first input terminal coupled to a first latch input terminal of latch 1702, and a second latch input terminal coupled to a second input terminal of latch 1702. The first input terminal of common-mode module 1707 and the second input terminal of common-mode module 1707 may have low impedance values and are properly matched. According to some embodiments, common-mode module 1707 is configured on a signal path to accommodate the common-mode current induced by CMT to flow through such that the common-mode transient voltage can be reduced. When CMT occurs between the first die and the second die, the common-mode current induced by CMT would flow through common-mode module 1707, and the change of common-mode voltages at nodes C and C' can thus be reduced; the common-mode voltage that is converted into differential-mode voltage can also be reduced, thereby enhancing the CMTI of the isolation circuit.

Figure 18:
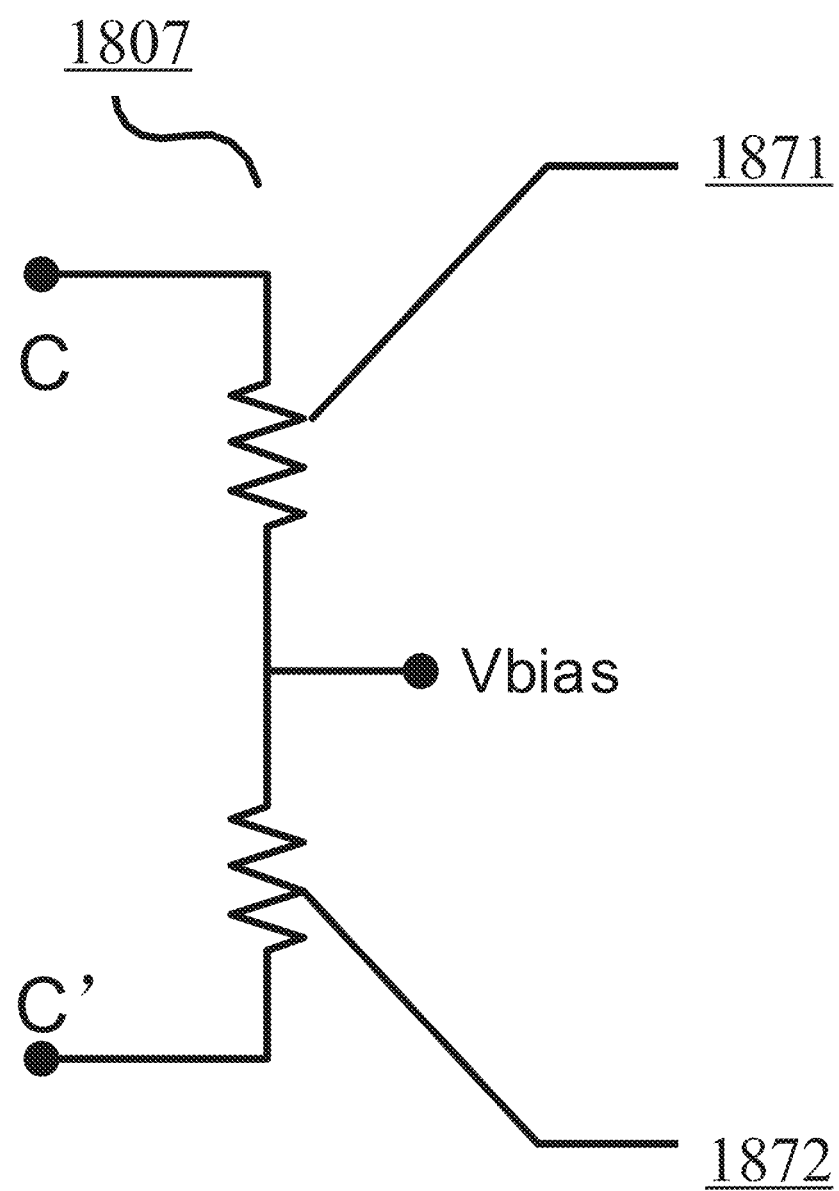
FIG. 18 schematically illustrates a diagram of a common-mode module according to an embodiment of the present disclosure.

FIG. 18 schematically illustrates a diagram of a common-mode module according to an embodiment of the present disclosure. This diagram is merely an example, which should not unduly limit the scope of the claims. One of ordinary skill in the art would recognize many variations, alternatives, and modifications. In some embodiments, common-mode module 1807 may include a first input terminal configured to receive a first common-mode input signal (i.e., the second differential signal), a second input terminal configured to receive a second common-mode input signal (i.e., the fourth differential signal), a first resistor 1871 coupled to the first input terminal of the common-mode module 1807, and a second resistor 1872 coupled to the second input terminal of the common-mode module 1807. For example, first resistor 1871 and second resistor 1872 may also be referred to as a resistor pair. The first input terminal of common-mode module 1807 may be coupled to the first latch input terminal, and the second input terminal of common-mode module 1807 may be coupled to the second latch input terminal.

First resistor 1871 and second resistor 1872 are coupled to a bias voltage (e.g., $V_{bias}$). The bias voltage $V_{bias}$ may be ground, or a supply voltage of the second die, or a bias voltage with a specified value. In some embodiments, the bias voltage $V_{bias}$ may be associated with a common-mode input voltage of the latch (not shown). For example, the bias voltage $V_{bias}$ and the common-mode input voltage of the latch may both be coupled to the supply voltage of the second die (e.g., VDD2). When there is no CMT, common-mode voltages at nodes C and C' will be approximately equal to VDD2, and common-mode module 1807 is turned off.

According to some embodiments, when the voltage difference between a first ground terminal (e.g., GND1) and a second ground terminal (e.g., GND2) increases, positive CMT occurs, the common-mode current flows from the first die to the second die through common-mode module 1807. When the voltage difference between the ground of the first ground terminal (e.g., GND1) and the second ground terminal (e.g., GND2) decreases, negative CMT occurs, the common-mode current flows from the second die to the first die through common-mode module 1807. In some embodiments, first resistor 1871 and second resistor 1872 may have low impedance values such that the change of common-mode voltages $\Delta V_{cm}$ at nodes C and C' may be reduced. The impedance values of first resistor 1871 and second resistor 1872 may be properly matched to reduce the common-mode voltage converted into differential-mode voltage due to the impedance mismatch, the effective signal transmission can thus be enhanced.

Figure 19:
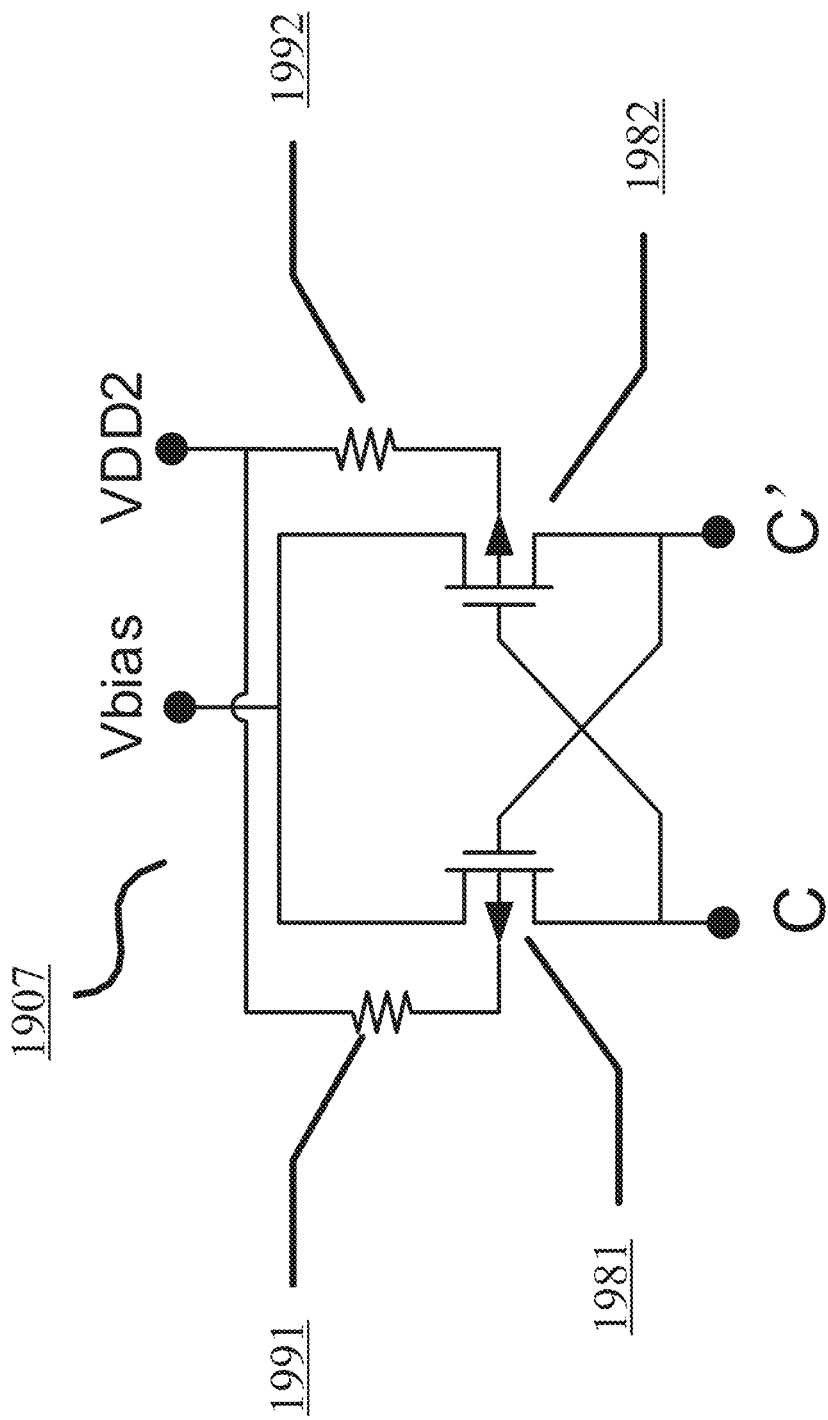
FIG. 19 schematically illustrates a diagram of a common-mode module according to another embodiment of the present disclosure.

FIG. 19 schematically illustrates a diagram of a common-mode module according to another embodiment of the present disclosure. This diagram is merely an example, which should not unduly limit the scope of the claims. One of ordinary skill in the art would recognize many variations, alternatives, and modifications. As mentioned above, common-mode module 1907 may also be referred to as a common-mode circuit. Common-mode circuit 1907 may comprise a crossover circuit. The crossover circuit may comprise a first switch and a second switch. For example, the crossover circuit may comprise P-type MOSFETs (also referred to as "PMOS transistors") configured in a crossover configuration. In some embodiments, common-mode module 1907 may include a first input terminal configured to receive a first common-mode input signal (i.e., the second differential signal), a second input terminal configured to receive a second common-mode input signal (i.e., the fourth differential signal), a first P-type MOSFET 1981 (i.e., the first switch), a second P-type MOSFET 1982 (i.e., the second switch), a first resistor 1991, and a second resistor 1992. According to some embodiments, first P-type MOSFET 1981 and second P-type MOSFET 1982 may be configured as a cross-coupled pair (i.e., the crossover circuit).

In some embodiments, a drain of first P-type MOSFET 1981 and a gate of second P-type MOSFET 1982 may be coupled to the first latch input terminal (e.g., node C); a gate of first P-type MOSFET 1981 and a drain of second P-type MOSFET 1982 may be coupled to the second latch input terminal (e.g., node C'); a source of first P-type MOSFET 1981 and a source of second P-type MOSFET 1982 may be coupled together to the bias voltage $V_{bias}$. In some embodiments, the bias voltage $V_{bias}$ may be ground, or a supply voltage of the second die (e.g., VDD2), or a bias voltage with a specified value. In some embodiments, the bias voltage $V_{bias}$ may be associated with a common-mode input voltage of the latch.

In some cases, a first terminal of first resistor 1991 and a first terminal of second resistor 1992 may be coupled together to the supply voltage of the second die VDD2. A second terminal of first resistor 1991 may be coupled to a bulk of first P-type MOSFET 1981, and a second terminal of second resistor 1992 may be coupled to a bulk of second P-type MOSFET 1982. The impedance value of first resistor 1991 and second resistor 1992 may be associated with the common-mode current generated due to CMT, so that the common-mode current may be adjusted through the adjustment of the impedance values of the resistors. First resistor 1991 may be configured to reduce the current flowing through the bulk of first P-type MOSFET 1981 during CMT. Second resistor 1992 may be configured to reduce the current flowing through the bulk of second P-type MOSFET 1982 during CMT.

Figure 20:
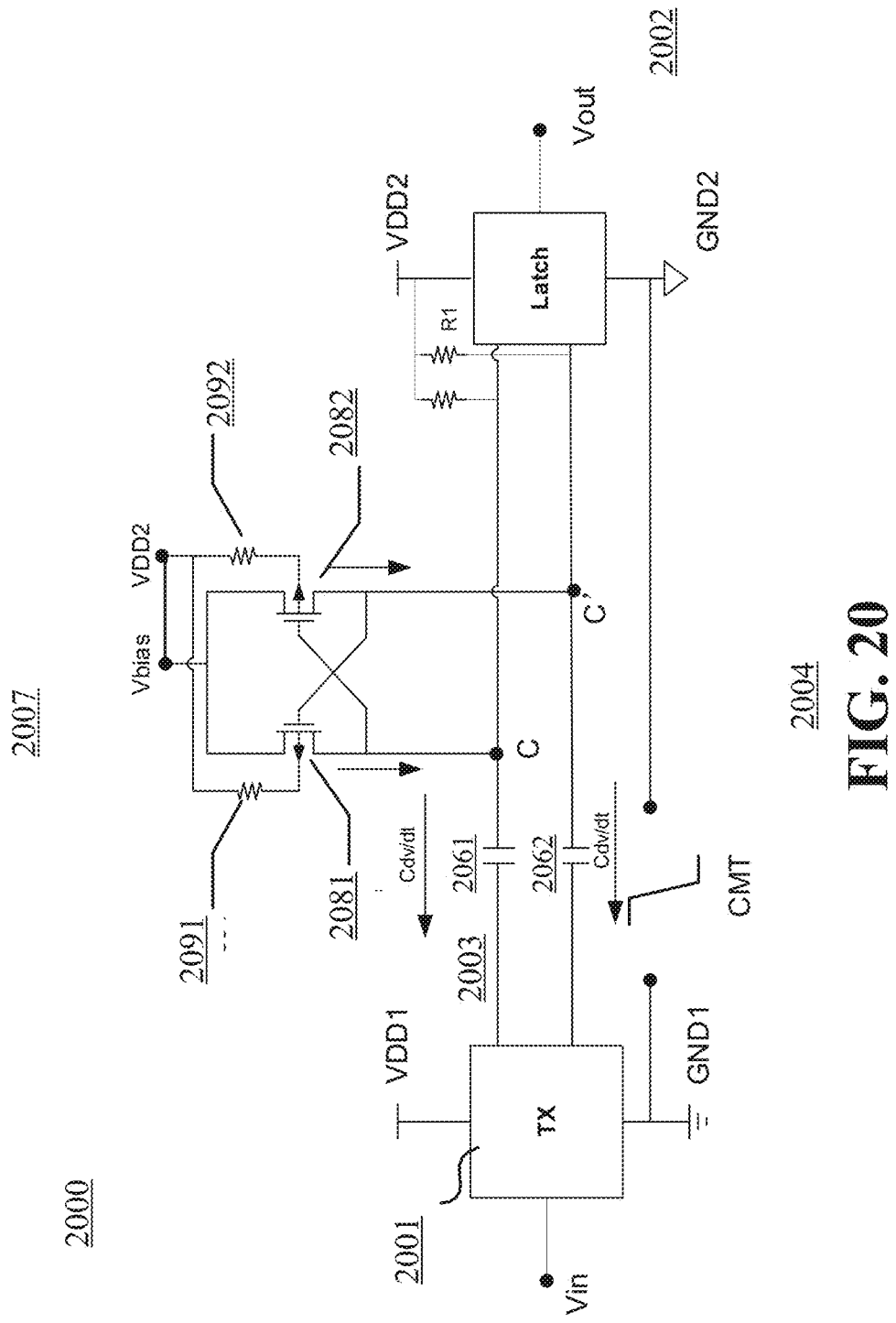
FIG. 20 schematically illustrates a diagram of an isolation circuit according to another embodiment of the present disclosure.

FIG. 20 schematically illustrates a simplified diagram of an isolation circuit according to another embodiment of the present disclosure. This diagram is merely an example, which should not unduly limit the scope of the claims. One of ordinary skill in the art would recognize many variations, alternatives, and modifications. As mentioned above, a common-mode module 2007 may also be referred to as a common-mode circuit 2007. Common-mode circuit 2007 may comprise a crossover circuit. In some embodiments, the common-mode module 2007 may be disposed on the second die (VDD2, GND2). In some implementations, a transmitter Tx 2001 may be configured on the first die. The transmitter Tx may be coupled to first isolation module 2061 and second isolation module 2062, respectively. In some cases, first isolation module 2061 may be referred to as a first input buffer, and second isolation module 2062 may be referred to as a second input buffer.

For example, common-mode circuit 2007 may be coupled to a supply voltage (e.g., VDD2). In some cases, common-mode circuit 2007 may be coupled to a second ground terminal (e.g., GND 2). For example, common-mode circuit 2007 may comprise a first switch and a second switch configured in a crossover configuration (i.e., the crossover circuit). The first switch may comprise a first P-type MOSFET 2081, and the second switch may comprise a second P-type MOSFET 2082. When there is no CMT, the voltages at nodes C and C' are relatively low, the first switch (e.g., first P-type MOSFET 2091) and the second switch (e.g., second P-type MOSFET 2092) may be turned off. When the voltage difference between a first ground terminal (e.g., GND1) and the second ground terminal (e.g., GND2) decreases, a negative CMT 2004 occurs between the first die and the second die, the common-mode current generated by CMT flows along first direction 2003, that is, from nodes C and C' to the first die through the first isolation module 2061 and the second isolation module 2062. Therefore, the voltages at nodes C and C' may be lower than the bias voltage $V_{bias}$, the first switch (e.g., first P-type MOSFET 2091) and the second switch (e.g., second P-type MOSFET 2092) may be turned on.

According to some embodiments, the common-mode current may be associated with the common-mode input impedance and the differential-mode input impedance of common-mode module 2007. When the common-mode current increases, the common-mode input impedance decreases, and the differential-mode input impedance increases accordingly. Therefore, when CMT occurs, the common-mode voltage caused by CMT may be reduced while the differential-mode voltage may be increased, so that the CMTI of the isolation circuit can be enhanced and the effective differential input signals of latch 2002 can be amplified.

The common-mode input impedance $R_{com}$ of common-mode module 2007 may be expressed by the following equation:

$$R_{com} = \frac{1}{g_{mp}}$$

where $g_{mp}$ is the transconductance of the cross-coupled MOSFETs (i.e., first P-type MOSFET 2091 and second P-type MOSFET 2092). The differential-mode input impedance of common-mode module 2007 may be expressed by the following equation:

$$R_{diff} = -\frac{2}{g_{mp}}$$

In some cases, the transconductance $g_{mp}$ may be proportional to the common-mode current generated by CMT. As is shown in the above equations, the larger the transconductance, the smaller the common-mode input impedance, the larger the differential-mode input impedance. Due to the impedance characteristic of common-mode module 2007, when negative CMT occurs between the first die and the second die, the common-mode noise may be reduced, and the effective differential input signals of latch 2002 may increase in amplitude. Therefore, common-mode module 2007 may be configured to enhance the CMTI of the isolation circuit and increase the effective differential input signals of latch 2002.

Figure 21:
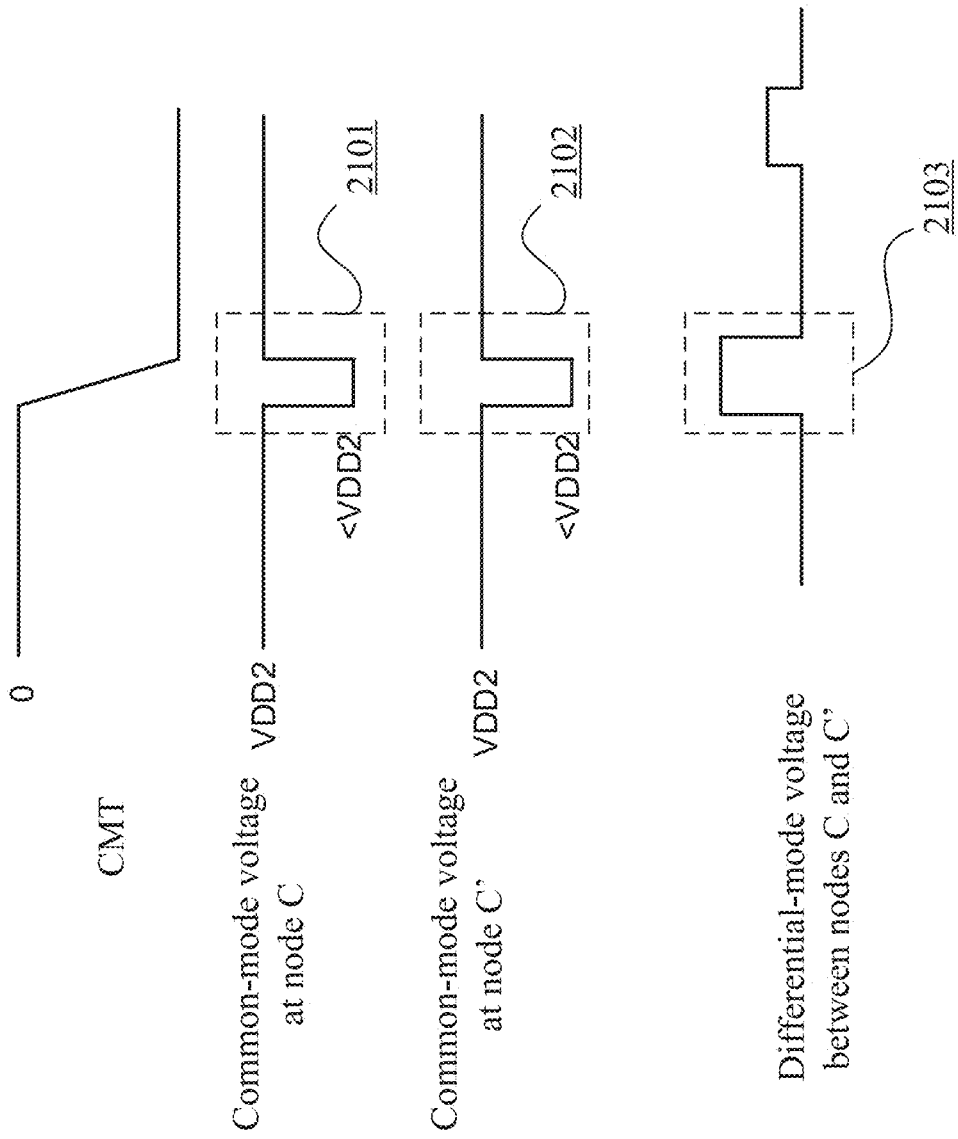
FIG. 21 schematically illustrates a timing diagram of the isolation circuit shown in FIG. 20 when negative CMT occurs.

FIG. 21 schematically illustrates a timing diagram of the isolation circuit shown in FIG. 20 when negative CMT occurs. As an example, when negative CMT occurs between the first die and the second die, the common-mode current generated by CMT flows from the second die to the first die through the isolation barrier (e.g., the first input buffer and/or the second input buffer). As shown in FIG. 21, the common-mode voltages at nodes C and C' may be lower than VDD2 during CMT at regions 2101 and 2102, common-mode module 2007 (i.e., the first switch and/or the second switch) may be turned on, the differential-mode voltage between nodes C and C' may be increased during CMT, thus the effective differential input signals of the latch may be increased at region 2103 as shown.

Figure 22:
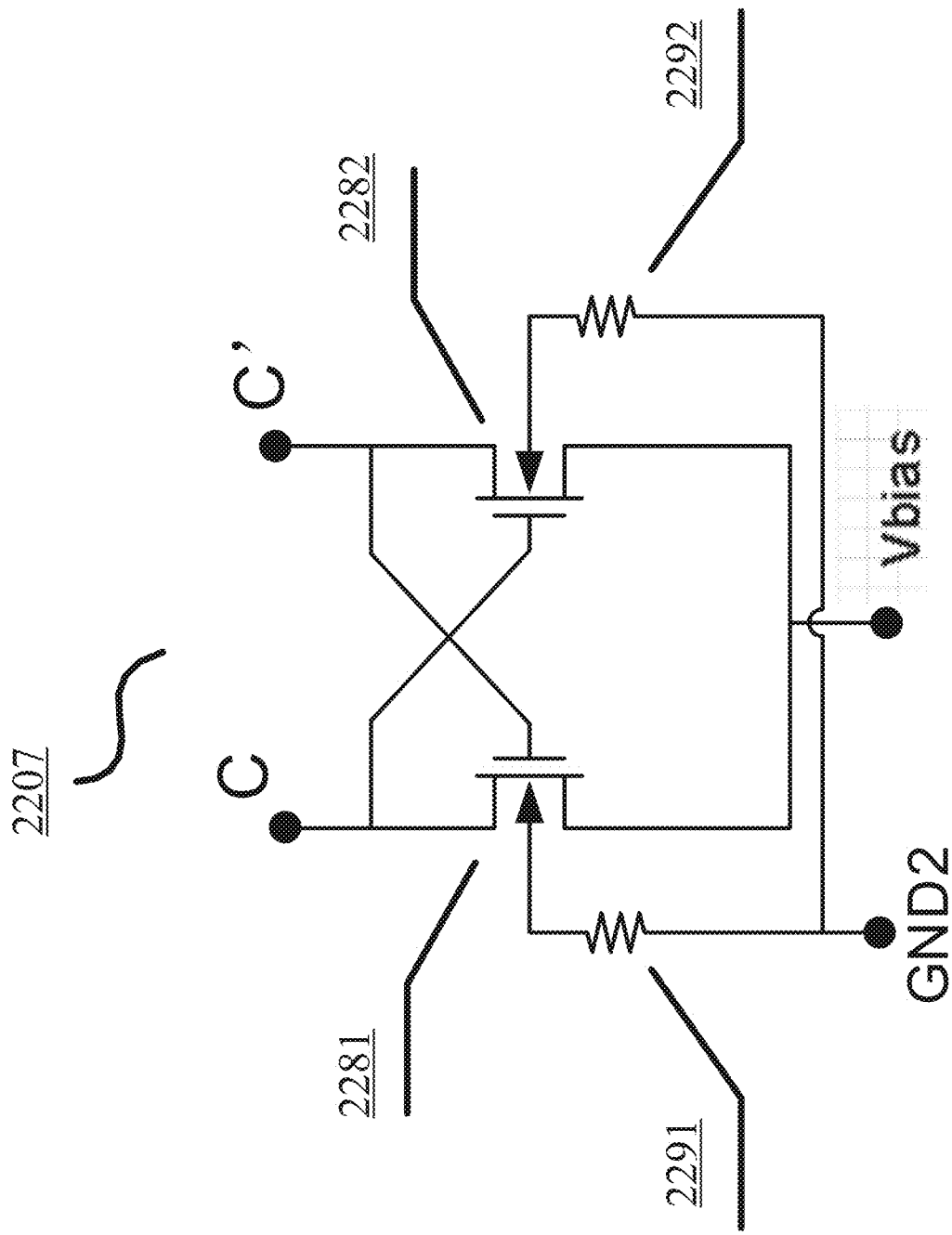
FIG. 22 schematically illustrates a diagram of a common-mode module according to another embodiment of the present disclosure.

FIG. 22 schematically illustrates a simplified diagram of a common-mode module 2207 according to another embodiment of the present disclosure. As mentioned above, common-mode module 2207 may also be referred to as a common-mode circuit. Common-mode circuit 2207 may comprise a crossover circuit. The crossover circuit may comprise a first switch and a second switch. For example, the crossover circuit may comprise N-type MOSFETs (also referred to as "NMOS transistors") configured in a crossover configuration. In some embodiments, common-mode module 2207 includes a first input terminal configured to receive a first common-mode input signal (i.e., the second differential signal), a second input terminal configured to receive a second common-mode input signal (i.e., the fourth differential signal), a first N-type MOSFET 2281 (i.e., the first switch), a second N-type MOSFET 2282 (i.e., the second switch), a first resistor 2291, and a second resistor 2292.

First resistor 2291 and second resistor 2292 may also be referred to as a resistor pair. The first switch (i.e., first N-type MOSFET 2281) may be coupled to the second differential signal, and the second switch (i.e., second N-type MOSFET 2282) may be coupled to the fourth differential signal.

According to some embodiments, first N-type MOSFET 2281 and second N-type MOSFET 2282 may be configured as a cross-coupled pair (i.e., the crossover circuit). A drain of first N-type MOSFET 2281 and a gate of second N-type MOSFET 2282 may be coupled to the first latch input terminal; a gate of first N-type MOSFET 2281 and a drain of second N-type MOSFET 2282 may be coupled to the second latch input terminal; a source of first N-type MOSFET 2281 and a source of second N-type MOSFET 2282 may be coupled together to the bias voltage $V_{bias}$. In some embodiments, the bias voltage $V_{bias}$ may be ground, or a supply voltage of the second die, or a bias voltage with a specified value.

In some embodiments, the bias voltage $V_{bias}$ may be associated with a common-mode input voltage of the latch. In some cases, a first terminal of first resistor 2291 and a first terminal of second resistor 2292 may be coupled together to second ground terminal (e.g., GND2). A second terminal of first resistor 2291 may be coupled to a bulk of first N-type MOSFET 2281, and a second terminal of second resistor 2292 may be coupled to a bulk of second N-type MOSFET 2282. The impedance value of first resistor 2291 and second resistor 2292 may be associated with the common-mode current generated due to CMT, so that the common-mode current may be adjusted through the adjustment of the impedance values of the resistors (e.g., 2291, 2292). First resistor 2291 may be configured to reduce the current flowing through the bulk of first N-type MOSFET 2281 during CMT. Second resistor 2292 may be configured to reduce the current flowing through the bulk of second P-type MOSFET 2282 during CMT.

In some embodiments, when the voltage difference between a first ground terminal (e.g., GND1) and a second ground terminal (e.g., GND2) increases, positive CMT occurs between the first die and the second die, the common-mode current generated by CMT flows from the first die to nodes C and C' through the first input buffer and/or the second input buffer. Therefore, the voltages at nodes C and C' may be higher than the bias voltage $V_{bias}$, the first switch (e.g., first N-type MOSFET 2291) and the second switch (e.g., second N-type MOSFET 2292) may be turned on. According to some embodiments, the common-mode current may be associated with the common-mode input impedance and the differential-mode input impedance of common-mode module 2207. When the common-mode current increases, the common-mode input impedance decreases, and the differential-mode input impedance increases accordingly. Therefore, when CMT occurs, the common-mode voltage caused by CMT may be reduced while the differential-mode voltage may be increased, so that the CMTI of the isolation circuit may be enhanced and the effective differential input signals of the latch may be amplified. That is, common-mode module 2207 may be configured to enhance the CMTI of the isolation circuit and increase the effective differential input signals of the latch.

Figure 23:
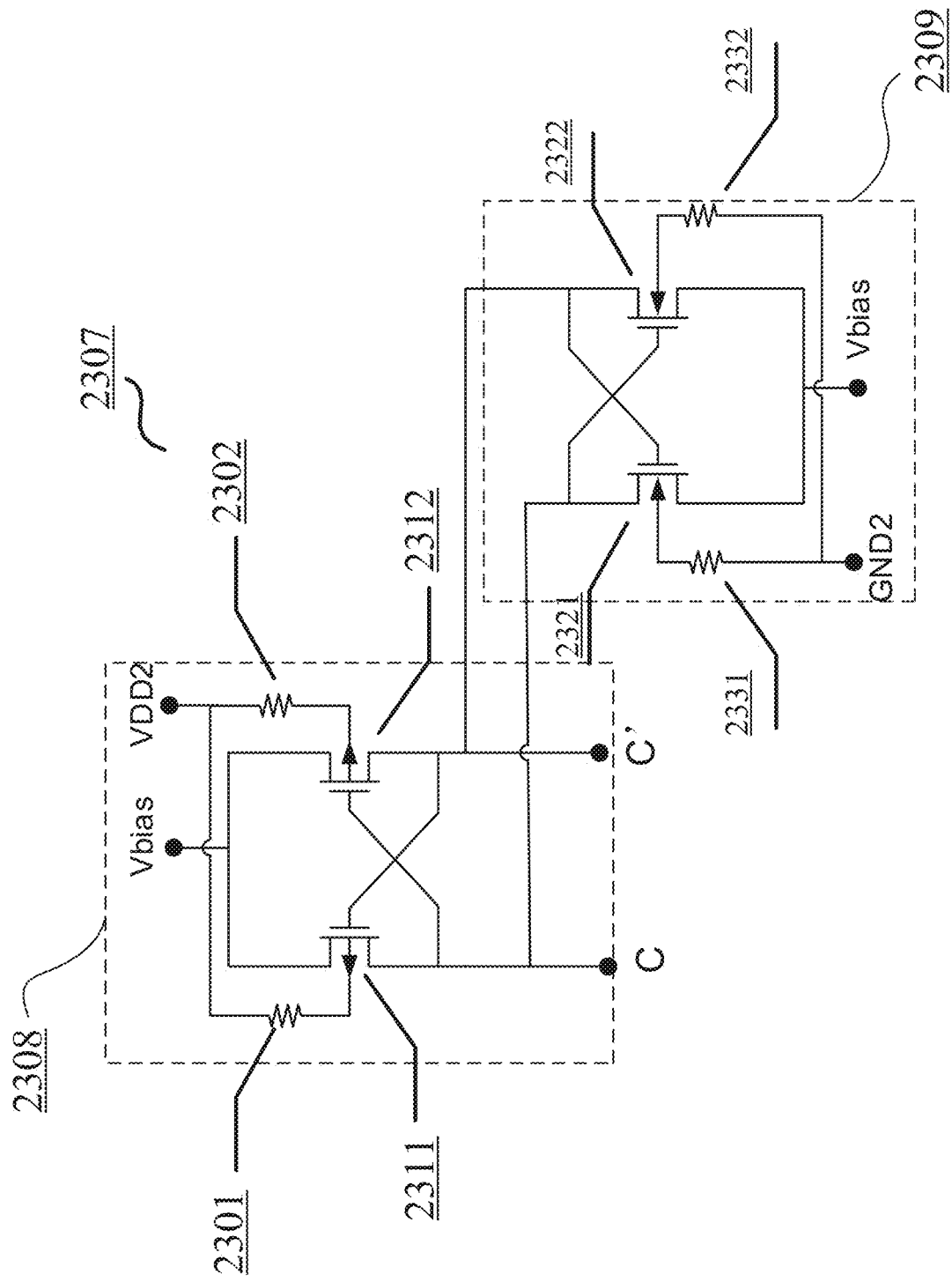
FIG. 23 schematically illustrates a diagram of a common-mode module according to another embodiment of the present disclosure.

FIG. 23 schematically illustrates a diagram of a common-mode module according to another embodiment of the present disclosure. This diagram is merely an example, which should not unduly limit the scope of the claims. One of ordinary skill in the art would recognize many variations, alternatives, and modifications. As mentioned above, common-mode module 2307 may also be referred to as a common-mode circuit. Common-mode circuit 2307 may comprise a first crossover circuit 2308 and a second crossover circuit 2309. For example, first crossover circuit 2308 may comprise P-type MOSFETs (also referred to as "PMOS transistors") configured in a crossover configuration. For example, second crossover circuit 2309 may comprise N-type MOSFETs (also referred to as "NMOS transistors") configured in a crossover configuration. According to some embodiments, first crossover circuit 2308 may be coupled to a supply voltage (e.g., VDD2), and second crossover circuit 2309 may be coupled to a second ground terminal (e.g., GND2). In some embodiments, common-mode module 2307 may include a first input terminal configured to receive a first common-mode input signal (i.e., the second differential signal), a second input terminal configured to receive a second common-mode input signal (i.e., the fourth differential signal), first crossover circuit 2308 (also referred to as "first common-mode branch), second crossover circuit 2309 (also referred to as "second common-mode branch"). First common-mode branch 2308 may include a first P-type MOSFET 2311, a second P-type MOSFET 2312, a first resistor 2301, and a second resistor 2302. Second common-mode branch 2309 may include a first N-type MOSFET 2321, a second N-type MOSFET 2322, a third resistor 2331, and a fourth resistor 2332. First common-mode branch 2308 and second common-mode branch 2309 may be connected in parallel.

The impedance characteristic of first crossover circuit 2308 is similar to that of common-mode module 2007 shown in FIG. 20, and the impedance characteristic of second crossover circuit 2309 is similar to that of common-mode module 2207 shown in FIG. 22. In some embodiments, when the voltage difference between the first ground terminal GND1 and the second ground terminal GND2 decreases, negative CMT occurs between the first die and the second die, the common-mode current generated by CMT flows from nodes C and C' to the first die through the first isolation module (i.e., the first input buffer) and/or the second isolation module (i.e., the second input buffer). Therefore, the voltages at nodes C and C' may be lower than the bias voltage $V_{bias}$, first common-mode branch 2308 may be turned on, that is, first P-type MOSFET 2311 and second P-type MOSFET 2312 may be turned on, while second common-mode branch 2309 is turned off at the same time.

The common-mode current generated due to negative CMT may be associated with the common-mode input impedance and the differential-mode input impedance of first common-mode branch 2308. When the common-mode current increases, the common-mode input impedance decreases, and the differential-mode input impedance increases accordingly. Therefore, when negative CMT occurs, the common-mode voltage caused by CMT may be reduced while the differential-mode voltage may be increased, so that the CMTI of the isolation circuit may be enhanced and the effective differential input signals of the latch may be amplified. The common-mode input impedance and the differential-mode input impedance of first common-mode branch 2308 may be associated with the impedance value of each P-type MOSFET (e.g., 2311, 2312) and each resistor (e.g., 2301, 2302) of first common-mode branch 2308. First common-mode branch 2308 may be configured to enhance the CMTI of the isolation circuit and increase the effective differential input signals of the latch during negative CMT.

When the voltage difference between the first ground terminal GND1 and the second ground terminal GND2 increases, positive CMT occurs between the first die and the second die, the common-mode current generated by CMT flows from the first die to nodes C and C' through the first isolation module (i.e., the first input buffer) and the second isolation module (i.e., the second input buffer). Therefore, the voltages at nodes C and C' may be higher than the bias voltage $V_{bias}$, second common-mode branch 2309 may be turned on while first common-mode branch 2308 is turned off at the same time. The common-mode current generated due to positive CMT may be associated with the common-mode input impedance and the differential-mode input impedance of second common-mode branch 2309. When the common-mode current increases, the common-mode input impedance decreases, and the differential-mode input impedance increases accordingly. Therefore, when positive CMT occurs, the common-mode voltage caused by CMT may be reduced while the differential-mode voltage may be increased, so that the CMTI of the isolation circuit may be enhanced and the effective differential input signals of the latch may be amplified.

The common-mode input impedance and the differential-mode input impedance of second common-mode branch 2309 may be associated with the impedance value of each N-type MOSFET (e.g., 2321, 2322) and each resistor (e.g., 2331, 2332) of second common-mode branch 2309. Second common-mode branch 2309 may be configured to enhance the CMTI of the isolation circuit and increase the effective differential input signals of the latch during positive CMT. The structure and operating principles of common-mode module 2307 prevent the isolation circuit from the common-mode transient interference regardless of the direction of the common-mode current.

In order to increase the flexibility of circuit design and achieve flexible adjustment of the impedance value of common-mode circuit 2307, it is to be appreciated that first common-mode branch 2308 may further include a first diode (not shown) configured to connect first P-type MOSFET 2311 and second P-type MOSFET 2312, and/or second common-mode branch 2309 may further include a second diode (not shown) configured to connect first N-type MOSFET 2321 and second N-type MOSFET 2322.

Figure 24:
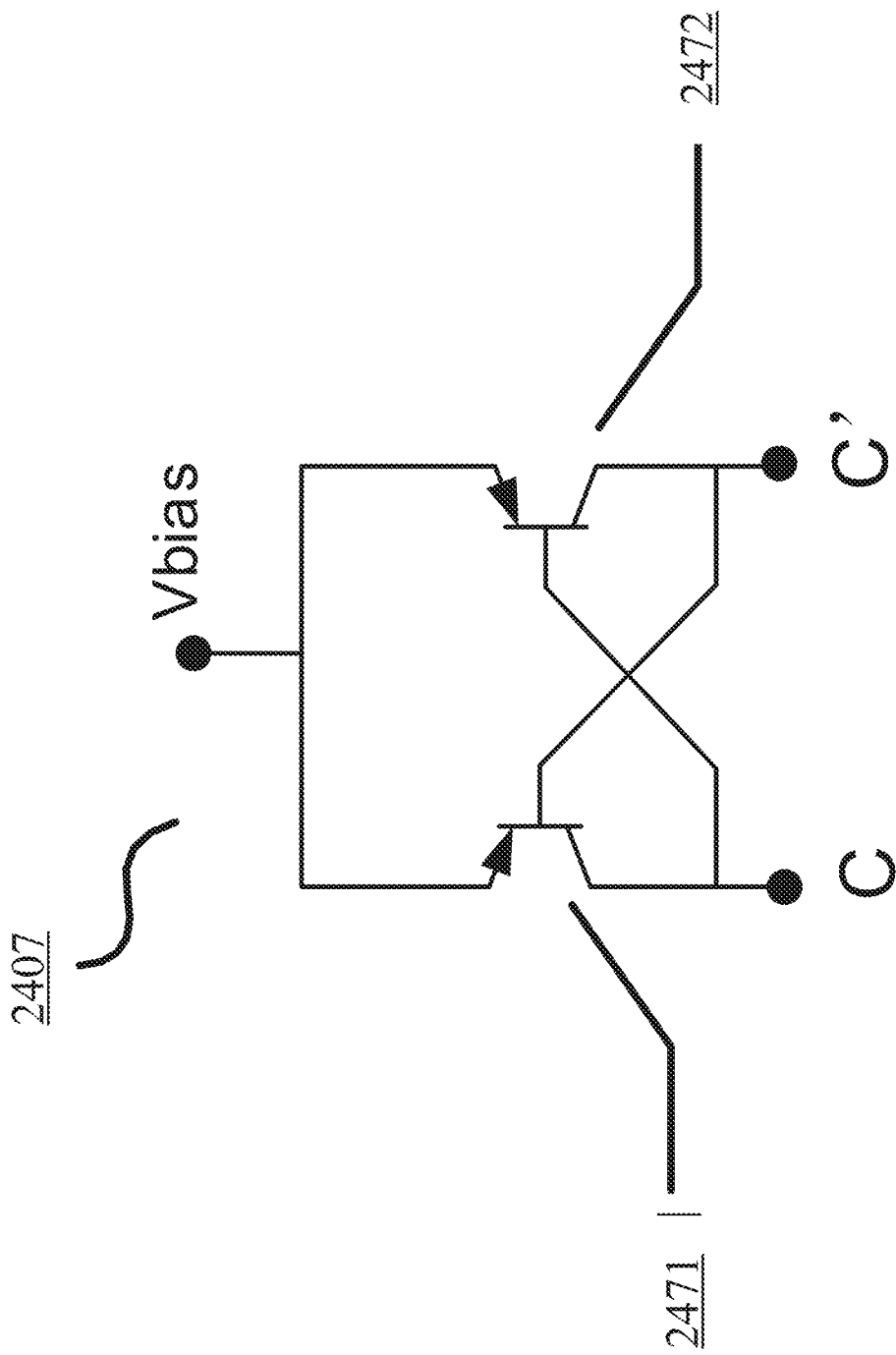
FIG. 24 schematically illustrates a diagram of a common-mode module according to another embodiment of the present disclosure.

FIG. 24 schematically illustrates a diagram of a common-mode module according to another embodiment of the present disclosure. This diagram is merely an example, which should not unduly limit the scope of the claims. One of ordinary skill in the art would recognize many variations, alternatives, and modifications. As mentioned above, common-mode module 2407 may also be referred to as a common-mode circuit. Common-mode circuit 2407 may comprise a crossover circuit. The crossover circuit may comprise a first switch and a second switch. For example, the crossover circuit may comprise BJT transistors configured in a crossover configuration. In some embodiments, common-mode module 2407 may include a first input terminal configured to receive a first common-mode input signal (i.e., the second differential signal), a second input terminal configured to receive a second common-mode input signal (i.e., the fourth differential signal), a first PNP transistor 2471 (i.e., the first switch), and a second PNP transistor 2472 (i.e., the second switch). According to some embodiments, first PNP transistor 2471 and second PNP transistor 2472 may be configured as a cross-coupled pair (i.e., the crossover circuit).

A collector terminal of first PNP transistor 2471 and a base terminal of second PNP transistor 2472 may be coupled to the first latch input terminal; a base terminal of first PNP transistor 2471 and a collector terminal of second PNP transistor 2472 may be coupled to the second latch input terminal; an emitter terminal of first PNP transistor 2471 and an emitter terminal of second PNP transistor 2472 may be coupled together to a bias voltage (e.g., $V_{bias}$). In some embodiments, the bias voltage $V_{bias}$ may be ground, or a supply voltage of the second die, or a bias voltage with a specified value. In some embodiments, the bias voltage $V_{bias}$ may be associated with a common-mode input voltage of the latch.

The impedance characteristic of common-mode module 2407 is similar to that of common-mode module 2007 shown in FIG. 20. In some embodiments, common-mode module 2407 may be disposed on the second die (VDD2, GND2). When there is no CMT, the voltages at nodes C and C' are relatively low, first PNP transistor 2471 and second PNP transistor 2472 may be turned off. When the voltage difference between a first ground terminal (e.g., GND1) and a second ground terminal (e.g., GND2) decreases, a negative CMT occurs between the first die and the second die, the common-mode current generated by CMT flows from nodes C and C' to the first die through the first isolation module (i.e., the first input buffer) and the second isolation module (i.e., the second input buffer). Therefore, the voltages at nodes C and C' may be lower than the bias voltage $V_{bias}$, first PNP transistor 2471 and second PNP transistor 2472 may be turned on.

According to some embodiments, the common-mode current may be associated with the common-mode input impedance and the differential-mode input impedance of common-mode module 2407. When the common-mode current increases, the common-mode input impedance decreases, and the differential-mode input impedance increases accordingly. Therefore, when negative CMT occurs, the common-mode voltage caused by CMT may be reduced while the differential-mode voltage may be increased, so that the CMTI of the isolation circuit may be enhanced and the effective differential input signals of the latch may be amplified.

The common-mode input impedance $R_{com}$ of common-mode module 2407 may be expressed by the following equation:

$$R_{com} = \frac{1}{gm_{pnp}}$$

where $gm_{pnp}$ is the transconductance of the cross-coupled PNP transistors (i.e., first PNP transistor 2471 and second PNP transistor 2472). The differential-mode input impedance of common-mode module 2407 may be expressed by the following equation:

$$R_{diff} = -\frac{2}{gm_{pnp}}$$

In some cases, the transconductance $g_{imp}$ may be proportional to the common-mode current generated by CMT. When the common-mode current increases, the transconductance $g_{imp}$ increases accordingly. As is shown in the above equations, the larger the transconductance, the smaller the common-mode input impedance, the larger the differential-mode input impedance. Due to the impedance characteristic of common-mode module 2407, when negative CMT occurs between the first die and the second die, the common-mode noise may be reduced, and the effective differential input signals of the latch may increase in amplitude. Therefore, common-mode module 2407 may be configured to enhance the CMTI of the isolation circuit and increase the effective differential input signals of the latch.

Figure 25:
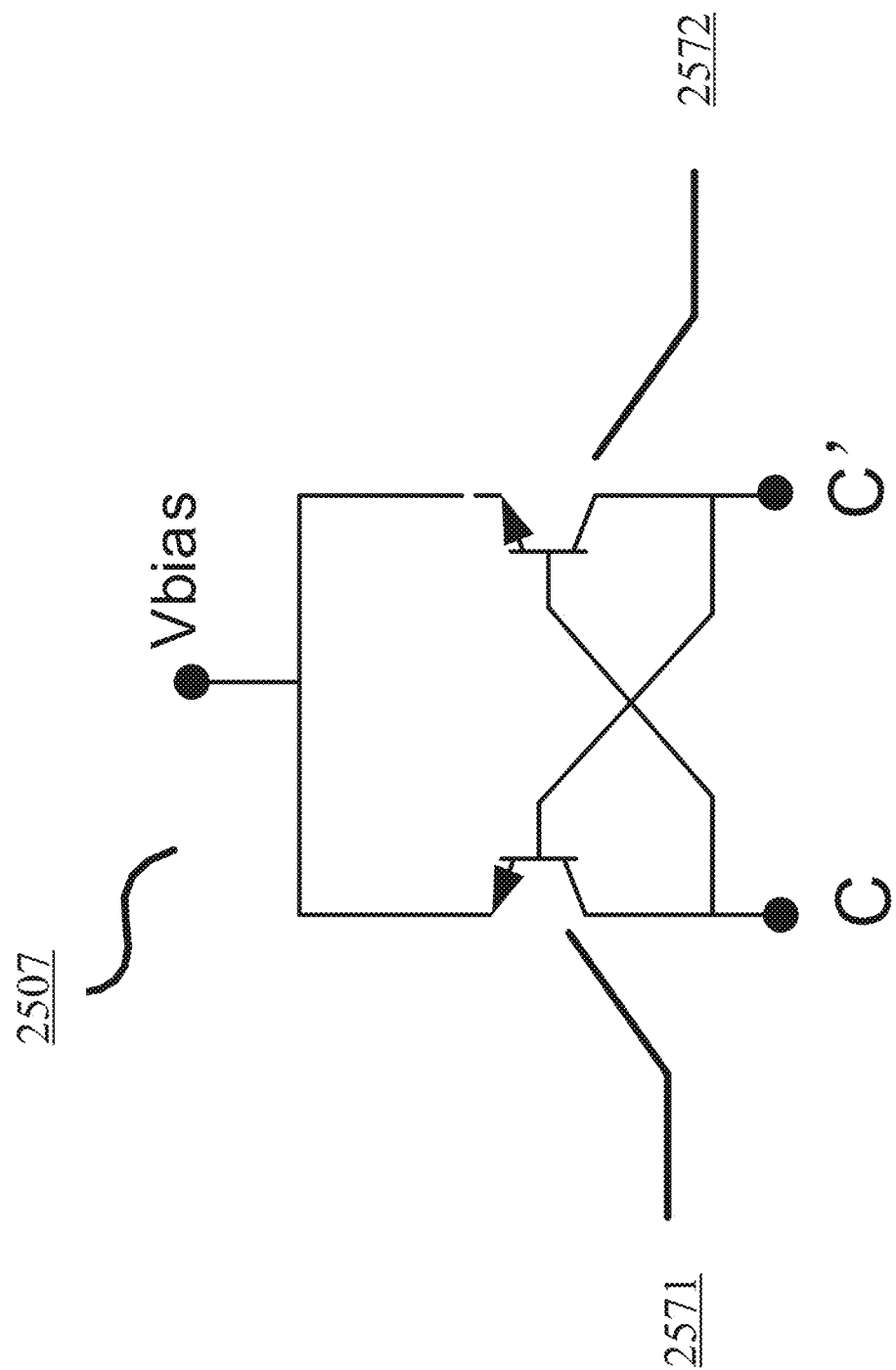
FIG. 25 schematically illustrates a diagram of a common-mode module according to another embodiment of the present disclosure.

FIG. 25 schematically illustrates a diagram of a common-mode module according to another embodiment of the present disclosure. This diagram is merely an example, which should not unduly limit the scope of the claims. One of ordinary skill in the art would recognize many variations, alternatives, and modifications. As mentioned above, common-mode module 2507 may also be referred to as a common-mode circuit. Common-mode circuit 2507 may comprise a crossover circuit. The crossover circuit may comprise a first switch and a second switch. For example, the crossover circuit may comprise BJT transistors configured in a crossover configuration. In some embodiments, common-mode module 2507 may include a first input terminal configured to receive a first common-mode input signal (i.e., the second differential signal), a second input terminal configured to receive a second common-mode input signal (i.e., the fourth differential signal), a first NPN transistor 2571 (i.e., the first switch), and a second NPN transistor 2572 (i.e., the second switch).

According to some embodiments, first NPN transistor 2571 and second NPN transistor 2572 may be configured as a cross-coupled pair (i.e., the crossover circuit). A collector terminal of first NPN transistor 2571 and a base terminal of second NPN transistor 2572 may be coupled to the first latch input terminal; a base terminal of first NPN transistor 2571 and a collector terminal of second NPN transistor 2572 may be coupled to the second latch input terminal; an emitter terminal of first NPN transistor 2571 and an emitter terminal of second NPN transistor 2572 may be coupled together to a bias voltage (e.g., $V_{bias}$). In some embodiments, the bias voltage $V_{bias}$ may be ground, or a supply voltage of the second die, or a bias voltage with a specified value. In some embodiments, the bias voltage $V_{bias}$ may be associated with a common-mode input voltage of the latch.

In some embodiments, when the voltage difference between the first ground terminal GND1 and the second ground terminal GND2 increases, a positive CMT occurs between the first die and the second die, the common-mode current generated by CMT flows from the first die to nodes C and C' through the first isolation module (i.e., the first input buffer) and/or the second isolation module (i.e., the second input buffer). Therefore, the voltages at nodes C and C' may be higher than the bias voltage $V_{bias}$, first NPN transistor 2571 and second NPN transistor 2572 may be turned on. According to some embodiments, the common-mode current may be associated with the common-mode input impedance and the differential-mode input impedance of common-mode module 2507. When the common-mode current increases, the common-mode input impedance decreases, and the differential-mode input impedance increases accordingly. Therefore, when positive CMT occurs, the common-mode voltage caused by CMT may be reduced while the differential-mode voltage may increase, so that the CMTI of the isolation circuit may be enhanced and the effective differential input signals of the latch may be amplified.

The impedance characteristic of common-mode module 2507 is similar to that of common-mode module 2207 shown in FIG. 22. When positive CMT occurs between the first die and the second die, the common-mode noise may be reduced, and the effective differential input signals of the latch may increase in amplitude. Therefore, common-mode module 2507 may be configured to enhance the CMTI of the isolation circuit and increase the effective differential input signals of the latch.

Figure 26:
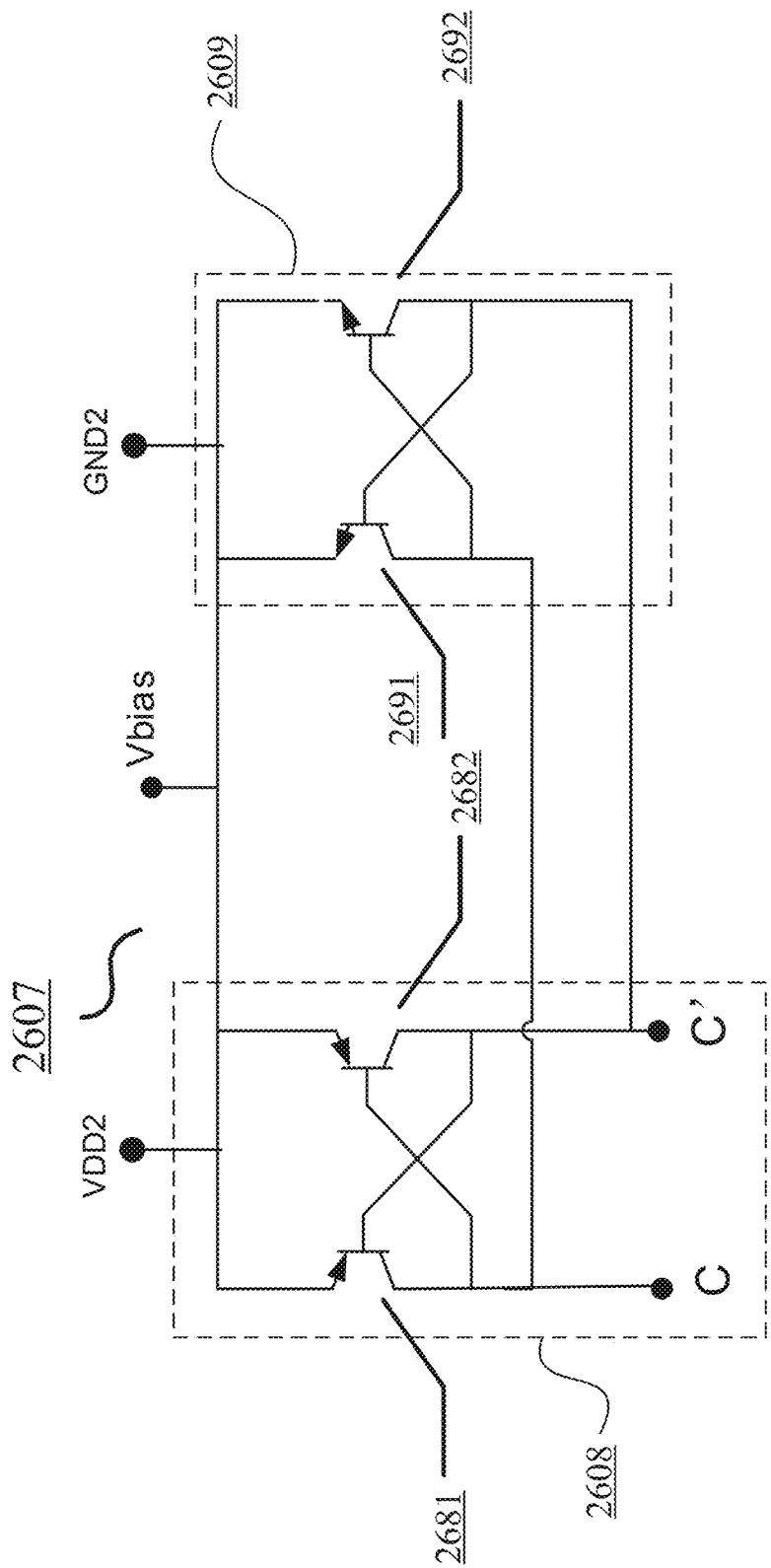
FIG. 26 schematically illustrates a diagram of a common-mode module according to another embodiment of the present disclosure.

FIG. 26 schematically illustrates a diagram of a common-mode module according to an embodiment of the present disclosure. This diagram is merely an example, which should not unduly limit the scope of the claims. One of ordinary skill in the art would recognize many variations, alternatives, and modifications. As mentioned above, the common-mode module 2607 may also be referred to as a common-mode circuit. Common-mode circuit 2607 may comprise a first crossover circuit 2608 and a second crossover circuit 2609. For example, first crossover circuit 2608 may comprise BJT transistors configured in a crossover configuration. For example, second crossover circuit 2609 may comprise BJT transistors configured in a crossover configuration. According to some embodiments, first crossover circuit 2608 may be coupled to a supply voltage (e.g., VDD2), and second crossover circuit 2609 may be coupled to the second ground terminal (e.g., GND2). In some embodiments, common-mode module 2607 may include a first input terminal configured to receive a first common-mode input signal (i.e., the second differential signal), a second input terminal configured to receive a second common-mode input signal (i.e., the fourth differential signal), first crossover circuit 2608 (also referred to as "first common-mode branch), and second crossover circuit 2609 (also referred to as "second common-mode branch). First common-mode branch 2608 may include a first PNP transistor 2681, and a second PNP transistor 2682. Second common-mode branch 2609 may include a first NPN transistor 2691, and a second NPN transistor 2692. First common-mode branch 2608 and second common-mode branch 2609 may be connected in parallel.

The impedance characteristic of first crossover circuit 2608 is similar to that of common-mode module 2407 shown in FIG. 24, and the impedance characteristic of second crossover circuit 2609 is similar to that of common-mode module 2507 shown in FIG. 25. In some embodiments, when the voltage difference between a first ground terminal (e.g., GND1) and the second ground terminal (e.g., GND2) decreases, a negative CMT occurs between the first die and the second die, the common-mode current generated by CMT flows from nodes C and C' to the first die through the first isolation module (i.e., the first input buffer) and the second isolation module (i.e., the second input buffer). Therefore, the voltages at nodes C and C' may be lower than the bias voltage $V_{bias}$, first common-mode branch 2608 may be turned on while second common-mode branch 2609 is turned off at the same time.

The common-mode current generated due to negative CMT may be associated with the common-mode input impedance and the differential-mode input impedance of first common-mode branch 2608. When the common-mode current increases, the common-mode input impedance decreases, and the differential-mode input impedance increases accordingly. The common-mode input impedance and the differential-mode input impedance of the first common-mode branch may be associated with the impedance value of each PNP transistor (e.g., 2681, 2682) of first common-mode branch 2608. First common-mode branch 2608 may be configured to enhance the CMTI of the isolation circuit and increase the effective differential input signals of the latch during negative CMT.

When the voltage difference between the first ground terminal GND1 and the second ground terminal GND2 increases, a positive CMT occurs between the first die and the second die, the common-mode current generated by CMT flows from the first die to nodes C and C' through the first isolation module (i.e., the first input buffer) and the second isolation module (i.e., the second input buffer). Therefore, the voltages at nodes C and C' may be higher than the bias voltage $V_{bias}$, second common-mode branch 2609 may be turned on while first common-mode branch 2608 is turned off at the same time. The common-mode current generated due to positive CMT may be associated with the common-mode input impedance and the differential-mode input impedance of second common-mode branch 2609. When the common-mode current increases, the common-mode input impedance decreases, and the differential-mode input impedance increases accordingly. Therefore, when CMT occurs, the common-mode voltage caused by CMT may be reduced while the differential-mode voltage may increase, so that the CMTI of the isolation circuit may be enhanced and the effective differential input signals of the latch may be amplified.

The common-mode input impedance and the differential-mode input impedance of the second common-mode branch may be associated with the impedance value of each NPN transistor (e.g., 2691, 2692) of second common-mode branch 2609. Second common-mode branch 2609 may be configured to enhance the CMTI of the isolation circuit and increase the effective differential input signals of the latch during negative CMT. The structure and operating principles of common-mode module 2607 prevent the isolation circuit from the common-mode transient interference regardless of the direction of the common-mode current.

In order to increase the flexibility of circuit design and achieve flexible adjustment of the impedance value of the common-mode circuit 2607, it is to be appreciated that first common-mode branch 2608 may further include a first diode (not shown) configured to connect first PNP transistor 2681 and second PNP transistor 2682, and/or second common-mode branch 2609 may further include a second diode (not shown) configured to connect first NPN transistor 2691 and second NPN transistor 2692.

Figure 27:
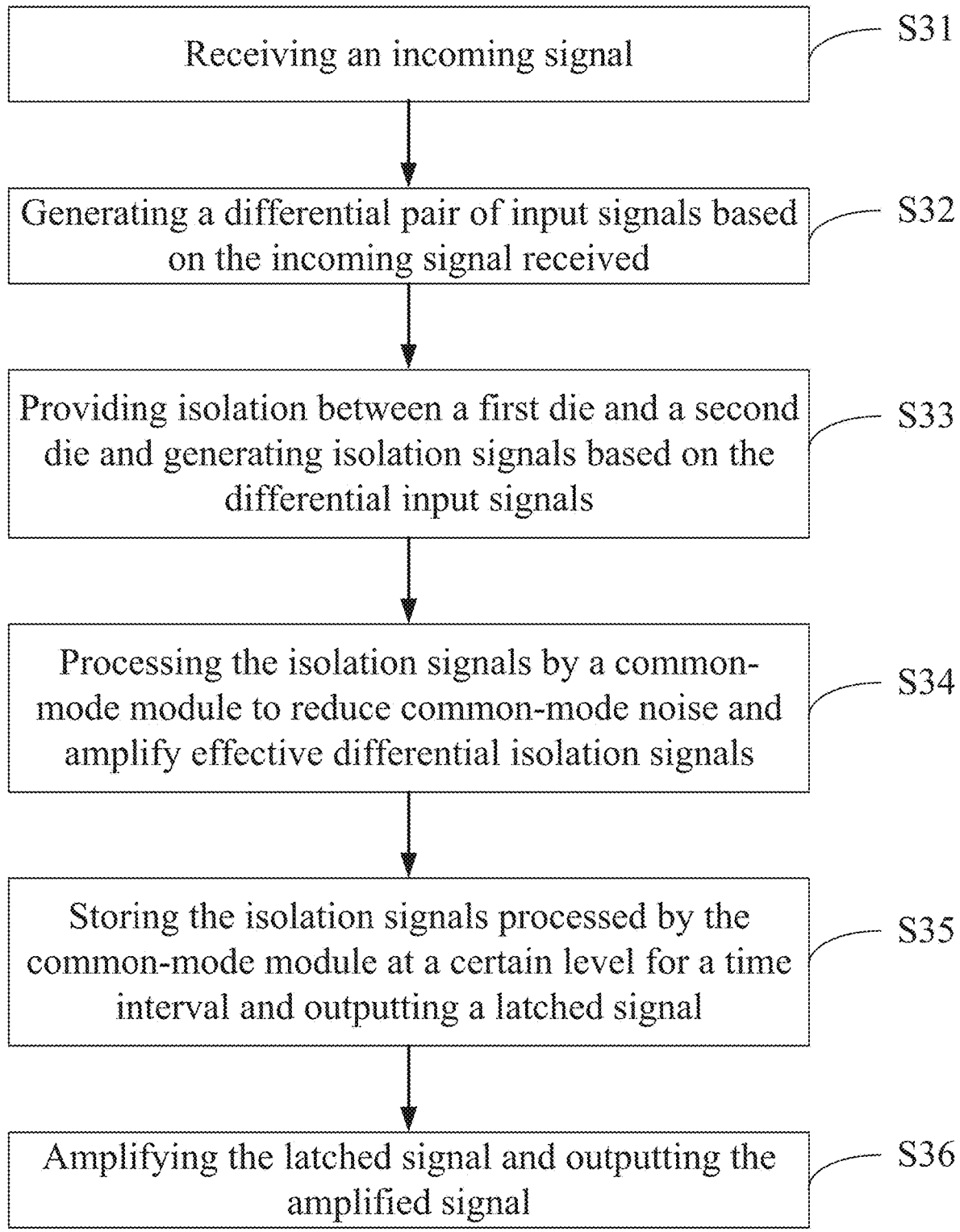
FIG. 27 schematically illustrates a flow diagram of a method for providing isolation between two dies according to an embodiment of the present disclosure.

FIG. 27 schematically illustrates a flow diagram of a method for providing isolation between two dies according to an embodiment of the present disclosure. This diagram is merely an example, which should not unduly limit the scope of the claims. One of ordinary skill in the art would recognize many variations, alternatives, and modifications. For example, one or more of steps may be added, removed, replaced, repeated, rearranged, and/or overlapped, and should not limit the scope of claims. A method for providing isolation between two dies may include:

S31, receiving an incoming signal;

S32, generating a differential pair of input signals based on the incoming signal received;

S33, providing isolation between a first die and a second die and generating isolation signals based the differential input signals, wherein the isolation signals are smaller than the input signals in amplitude;

S34, processing the isolation signals by a common-mode module to reduce common-mode noise and amplify effective differential isolation signals, wherein the processed isolation signals are amplified when CMT occurs;

S35, storing the isolation signals processed by the common-mode module at a certain level for a time interval and outputting a latched signal;

S36, amplifying the latched signal and outputting the amplified signal.

Figure 28:
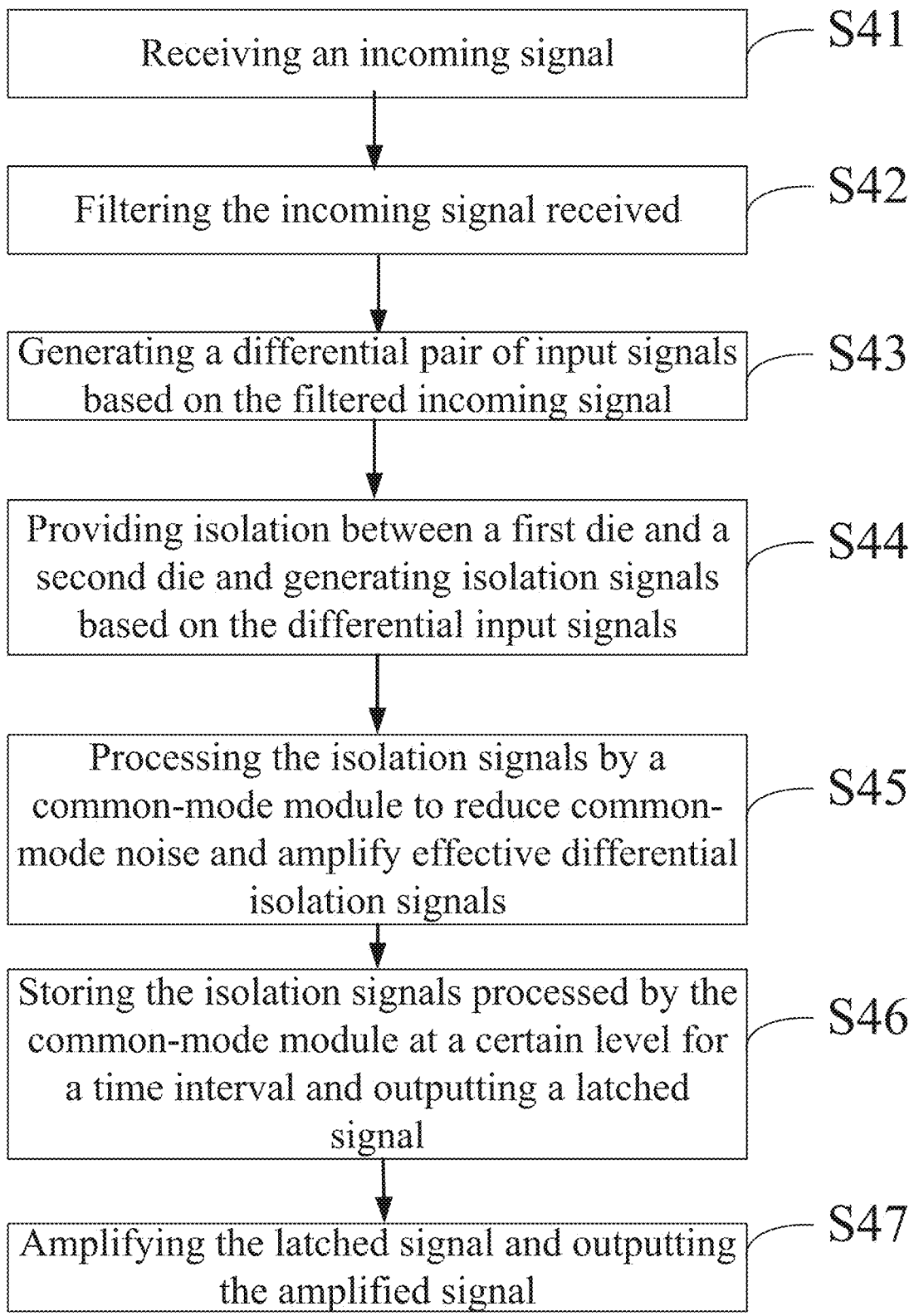
FIG. 28 schematically illustrates a flow diagram of a method for providing isolation between two dies according to another embodiment of the present disclosure.

FIG. 28 schematically illustrates a flowchart of a method for providing isolation between two dies according to another embodiment of the present disclosure. This diagram is merely an example, which should not unduly limit the scope of the claims. One of ordinary skill in the art would recognize many variations, alternatives, and modifications. For example, one or more of steps may be added, removed, replaced, repeated, rearranged, and/or overlapped, and should not limit the scope of claims. In some embodiments, the method for providing isolation between two dies may further include a filtering step. As shown in FIG. 15, the method for providing isolation between two dies may further include S41, S42, S43, S44, S45, S46, S47. In S42, the incoming signal received may be filtered before generating a differential pair of input signals. Other steps of S41, S43, S44, S45, S46, S47 may be similar to the corresponding steps in FIG. 27 and are not described in detail hereafter. The method in FIGS. 27 and 28 may be implemented in any system including the isolation circuit according to an embodiment of the present disclosure. More details of the method may refer to the description of the isolation circuit, and are not described in detail hereinafter.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A digital isolator device comprising:
a first input buffer configured to receive a first differential signal from a transmitter and to provide a second differential signal, the first differential signal being characterized by a first magnitude, the second differential signal being characterized by a second magnitude, the first magnitude being greater than the second magnitude, the transmitter being coupled to a first ground terminal, the first input buffer being coupled to a second ground terminal;
a second input buffer configured to receive a third differential signal from the transmitter and to provide a fourth differential signal, the second input buffer being coupled to the second ground terminal;
a common-mode circuit coupled to the second differential signal and the fourth differential signal, the common-mode circuit being coupled to a bias voltage and comprising a resistor pair, the common-mode circuit being configured to reduce a common-mode transient voltage, the common-mode transient voltage being associated with a voltage differential between the first ground terminal and the second ground terminal; and
a latch circuit configured to store the second differential signal and the fourth differential signal for a time interval.

2. The digital isolator device of claim 1 wherein the transmitter is configured on a first die and the common-mode circuit is configured on a second die.

3. The digital isolator device of claim 1 further comprising an amplifier coupled to the latch circuit.

4. The digital isolator device of claim 1 wherein the common-mode circuit further comprising a crossover circuit.

5. The digital isolator device of claim 4 wherein the crossover circuit comprises a first switch and a second switch, the first switch being coupled to the second differential signal, the second switch being coupled to the fourth differential signal.

6. The digital isolator device of claim 5 wherein:
the first switch comprises a first drain, a first source, and a first gate, the first source being coupled to the bias voltage, the first gate being coupled to the second differential signal, the first drain being coupled to the fourth differential signal; and
the second switch comprises a second drain, a second source, and a second gate, the second source being coupled to the bias voltage, the second gate being coupled to the fourth differential signal, the second drain being coupled to the third differential signal.

7. The digital isolator device of claim 5 wherein the crossover circuit is coupled to a supply voltage.

8. The digital isolator device of claim 5 wherein the crossover circuit is coupled to the second ground terminal.

9. The digital isolator device of claim 1 wherein the common-mode circuit further comprising a first crossover circuit and a second crossover circuit, the first crossover circuit being coupled to a supply voltage, the second crossover circuit being coupled to the second ground terminal.

10. The digital isolator device of claim 9 wherein the first crossover circuit comprises a first pair of switches configured in parallel and a second pair of switches configured in parallel.

11. The digital isolator device of claim 1 wherein the common circuit comprises PMOS transistors configured in a crossover configuration.

12. The digital isolator device of claim 1 wherein the common circuit comprises BJT transistors configured in a crossover configuration.

13. The digital isolator device of claim 1 wherein:
the first input buffer comprises a first capacitor and a second capacitor, the first capacitor being directly coupled to the first differential signal, the second capacitor being directly coupled to the second ground terminal; and
a second input buffer comprises a third capacitor and a fourth capacitor, the third capacitor being directly coupled to the third differential signal, the fourth capacitor being directly coupled to the second ground terminal.

14. The digital isolator device of claim 1 further comprising an inverter configured to generate the third differential signal.

15. A digital isolator device comprising:
a latch module configured to store a first isolation signal and a second isolation signal for a time interval and output a latched signal, comprising:
a first latch input terminal configured to receive a first latch input signal; and
a second latch input terminal configured to receive a second latch input signal;
a common-mode module configured to receive a common-mode current generated due to the common-mode transient between a first die and a second die, comprising:
a first input terminal coupled to the first latch input terminal and configured to receive a first common-mode input signal;
a second input terminal coupled to the second latch input terminal and configured to receive a second common-mode input signal;
a first common-mode branch coupled to the first input terminal and characterized by a first impedance value; and
a second common-mode branch coupled to the second input terminal and characterized by a second impedance value;
wherein the latch module and the common-mode module are connected in parallel; and
wherein the common-mode current flowing through the common-mode module is associated with a common-mode voltage and a differential-mode voltage of the latch module.

16. The digital isolator device of claim 15, wherein:
the common-mode current is associated with the first impedance value of the first common-mode branch, the first impedance value being associated with the first latch input signal; and
the common-mode current is associated with the second impedance value of the second common-mode branch, the second impedance value being associated with the second latch input signal of the latch module.

17. The digital isolator device of claim 15, wherein the common-mode module is coupled to a bias voltage, the bias voltage being associated with a common-mode voltage of the latch module.

18. The digital isolator device of claim 17, wherein:
the first common-mode branch is turned on when input voltages of the latch module are lower than the bias voltage; and
the second common-mode branch is turned on when the input voltages of the latch module are higher than the bias voltage.

19. A method for providing isolation between two dies, comprising:
receiving an incoming signal;
generating a differential pair of input signals based on the incoming signal received;
providing isolation between a first die and a second die and generating isolation signals based on the differential input signals, wherein the isolation signals are smaller than the input signals in amplitude;
processing the isolation signals by a common-mode module to reduce common-mode noise;
storing the isolation signals processed by the common-mode module at a certain level for a time interval and outputting a latched signal; and
amplifying the latched signal and outputting the amplified signal.

20. The method for providing isolation between two dies of claim 19, wherein the common-mode module is configured to amplify effective differential isolation signals during common-mode transients.

* * * * *